(12) United States Patent
Wan et al.

(10) Patent No.: US 8,987,691 B2
(45) Date of Patent: Mar. 24, 2015

(54) ION IMPLANTER AND ION IMPLANT METHOD THEREOF

(71) Applicant: Advanced Ion Beam Technology, Inc., Fremont, CA (US)

(72) Inventors: Zhimin Wan, Sunnyvale, CA (US); John D. Pollock, Rowley, MA (US); Don Berrian, Topsfield, MA (US)

(73) Assignee: Advanced Ion Beam Technology, Inc., Hsin-Chu (TW)

(*) Notice: Subject to any disclaimer, the term of this patent is extended or adjusted under 35 U.S.C. 154(b) by 0 days.

(21) Appl. No.: 13/746,257

(22) Filed: Jan. 21, 2013

(65) Prior Publication Data

US 2013/0130484 A1 May 23, 2013

Related U.S. Application Data

(63) Continuation-in-part of application No. 12/553,946, filed on Sep. 3, 2009, now abandoned.

(51) Int. Cl.
| | |
|---|---|
| *H01J 37/00* | (2006.01) |
| *H01L 21/265* | (2006.01) |
| *C23C 14/04* | (2006.01) |
| *C23C 14/48* | (2006.01) |
| *C23C 14/50* | (2006.01) |
| *H01J 37/09* | (2006.01) |
| *H01J 37/317* | (2006.01) |

(52) U.S. Cl.
CPC .............. *H01L 21/265* (2013.01); *C23C 14/04* (2013.01); *C23C 14/48* (2013.01); *C23C 14/50* (2013.01); *H01J 37/09* (2013.01); *H01J 37/3171* (2013.01); *H01J 2237/1503* (2013.01); *H01J 2237/20228* (2013.01); *H01J 2237/30488* (2013.01)

USPC ................ 250/492.3; 250/492.1; 250/492.2; 250/492.21

(58) Field of Classification Search
None
See application file for complete search history.

(56) References Cited

U.S. PATENT DOCUMENTS

| | | | |
|---|---|---|---|
| 5,003,183 A | | 3/1991 | Nogami et al. |
| 5,834,787 A | | 11/1998 | Bunker |
| 5,898,179 A | * | 4/1999 | Smick et al. ............. 250/492.21 |
| 6,163,033 A | * | 12/2000 | Smick et al. ............. 250/441.11 |
| 6,207,959 B1 | * | 3/2001 | Satoh et al. ............. 250/442.11 |
| 6,207,964 B1 | | 3/2001 | McIntyre et al. |
| 6,437,351 B1 | * | 8/2002 | Smick et al. ............. 250/492.21 |

(Continued)

FOREIGN PATENT DOCUMENTS

| | | | |
|---|---|---|---|
| EP | 1580789 A2 | * | 9/2005 |
| EP | 1580789 A3 | * | 12/2010 |

(Continued)

*Primary Examiner* — Andrew Smyth
(74) *Attorney, Agent, or Firm* — Morrison & Foerster LLP

(57) ABSTRACT

An ion implanter and an ion implant method are disclosed. Essentially, the wafer is moved along one direction and an aperture mechanism having an aperture is moved along another direction, so that the projected area of an ion beam filtered by the aperture is two-dimensionally scanned over the wafer. Thus, the required hardware and/or operation to move the wafer may be simplified. Further, when a ribbon ion beam is provided, the shape/size of the aperture may be similar to the size/shape of a traditional spot beam, so that a traditional two-dimensional scan may be achieved. Optionally, the ion beam path may be fixed without scanning the ion beam when the ion beam is to be implanted into the wafer, also the area of the aperture may be adjustable during a period of moving the aperture across the ion beam.

27 Claims, 19 Drawing Sheets

(56) References Cited

U.S. PATENT DOCUMENTS

| | | | |
|---|---|---|---|
| 6,597,002 B1* | 7/2003 | Kondo | 250/492.2 |
| 6,770,888 B1 | 8/2004 | Benveniste et al. | |
| 7,897,944 B2 | 3/2011 | Mitchell et al. | |
| 8,089,052 B2 | 1/2012 | Tieger et al. | |
| 2003/0147059 A1* | 8/2003 | Tokuda et al. | 355/53 |
| 2003/0147060 A1* | 8/2003 | Tokuda et al. | 355/53 |
| 2005/0030508 A1* | 2/2005 | Tokuda et al. | 355/69 |
| 2005/0200823 A1* | 9/2005 | Tokuda et al. | 355/69 |
| 2007/0045557 A1* | 3/2007 | Angel et al. | 250/396 R |
| 2008/0073583 A1 | 3/2008 | Jasinski et al. | |
| 2008/0149857 A1 | 6/2008 | Ferrara et al. | |
| 2008/0169435 A1 | 7/2008 | Sakase et al. | |
| 2009/0283703 A1* | 11/2009 | Tamura | 250/492.3 |
| 2011/0092059 A1 | 4/2011 | Daniels et al. | |

FOREIGN PATENT DOCUMENTS

| | | | |
|---|---|---|---|
| JP | 5303954 A | 11/1993 | |
| JP | 05303954 A | * 11/1993 | H01J 37/317 |

\* cited by examiner

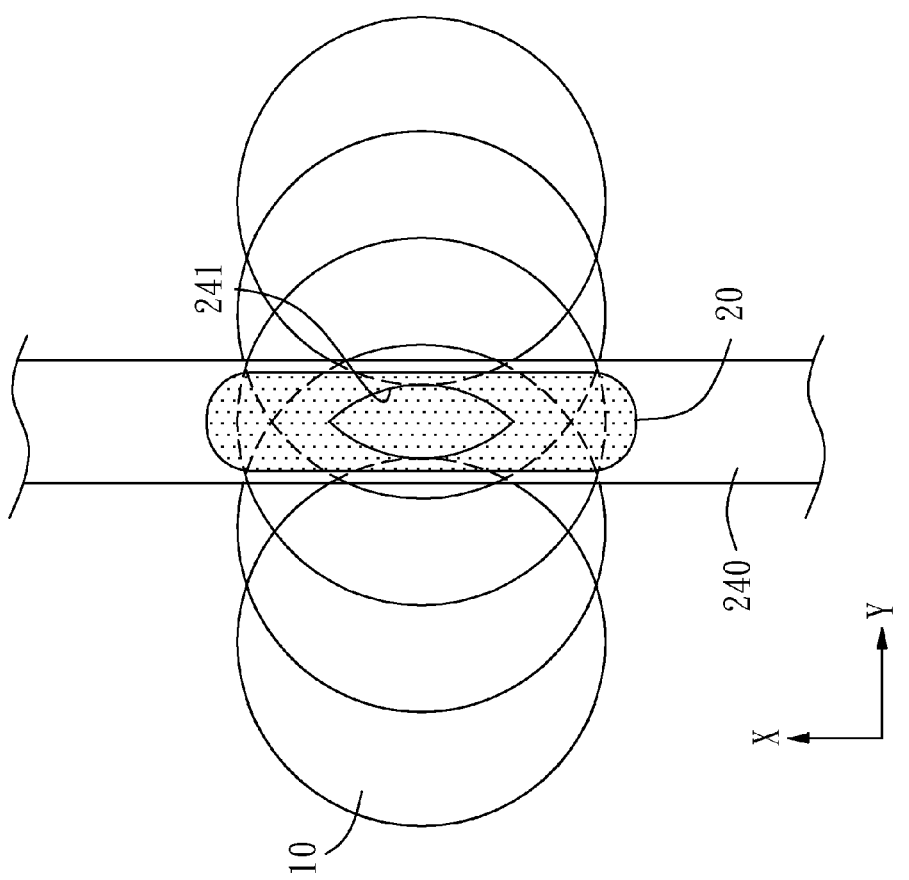
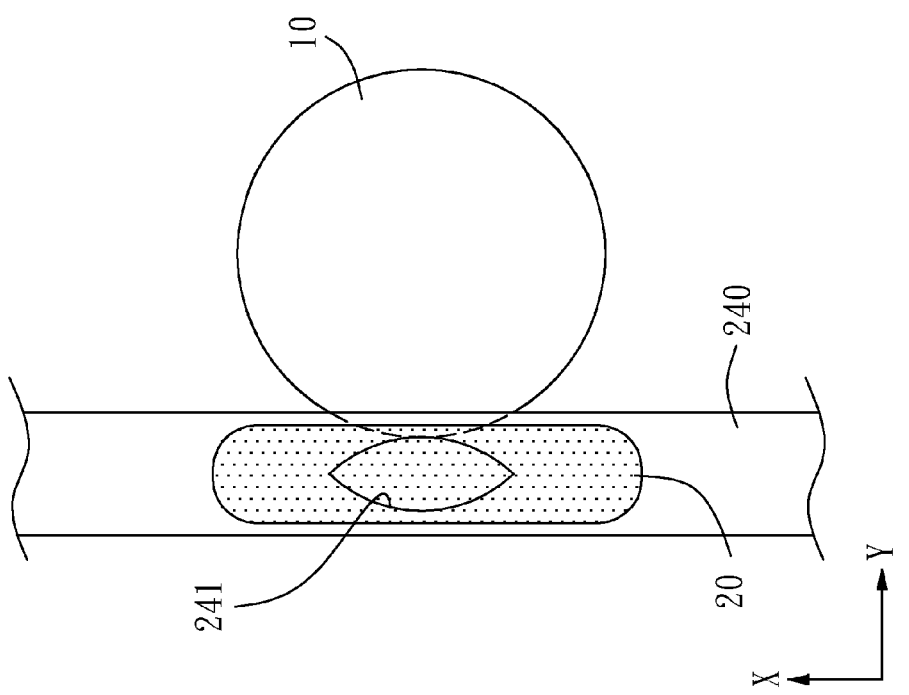

ION IMPLANTER AND ION IMPLANT METHOD THEREOF

CROSS-REFERENCE TO RELATED APPLICATIONS

This application is a continuation-in-part of U.S. application Ser. No. 12/553,946, filed on Sep. 3, 2009 and entitled ION IMPLANTER AND ION IMPLANT METHOD THEREOF, the entire contents of which are hereby incorporated by reference.

BACKGROUND OF THE INVENTION

1. Field of the Invention

The present invention generally relates to an ion implanter and an ion implant method, and more particularly, to implant a wafer by using both the wafer movement and the aperture movement, where the aperture is configured to filter an ion beam before wafer being implanted. Optionally, the size/shape of the aperture may be similar to that of a traditional spot beam when the ion beam is a ribbon ion beam, the incidental angle between the wafer and the ion beam may be fixed, and the aperture may be significantly smaller than the cross-section of the ion beam.

2. Description of Related Art

Ion implantation is a popular and important processing step performed during semiconductor manufacture, so that a wafer is implanted by an ion beam. The ion beam may be a spot ion beam or a ribbon ion beam, and the implanted wafer has a special dose distribution, no matter a uniform dose distribution or a non-uniform dose distribution (such as a wafer has different doped regions having different doses, even having different shapes/sizes).

FIG. 1A is a simplified diagram of a traditional ion implanter 100. The traditional implanter 100 includes an ion source 110 and an analyze magnet 120. The ion source 110 is used to generate an ion beam, and the analyze magnet 120 are used to filtered undesired ions out the ion beam before implanting the ion beam into the wafer 10. As usual, although not particularly illustrated, some electrodes and some magnets are positioned between the analyze magnet 120 and the wafer 10 to accelerate/decelerate the ion beam, deform/shape the ion beam, and/or to modify other properties of the ion beam before the wafer being implanted.

FIG. 1B shows a top view of the wafer 10 depicted in FIG. 1A. Several popular ion implant methods exist for property implanting the ion beam 20 into the wafer 10. If the wafer 10 is fixed, the ion beam 20 can be moved on a plane defined by the X-axis and the Y-axis. If the ion beam 20 is fixed, the wafer 10 can be moved on the plane defined by the X-axis and the Y-axis. Also, the ion beam 20 and the wafer 10 can be moved respectively along different directions on the plane defined by the X-axis and the Y-axis simultaneously.

The concept "fixed the ion beam" means that the ion beam is directed along a fixed ion beam path without scanning around the space close to the wafer, i.e., at least partial ion beam path proximate to the wafer is fixed. Under such situation, the wafer is moved across the ion beam, even also is moved along the ion beam, to ensure proper implantation. Depending on the required dose distribution over the wafer, both the scan path and the scan speed are adjustable parameters. Also, depending on the required dose distribution over the wafer, the ribbon ion beam and the spot ion beam may be flexibly used. Besides, depending on whether a spot ion beam or a ribbon ion beam is used, the scan path and the scan speed usually are flexibly adjusted.

However, when the size of the wafer is increased, the wafer must be correspondingly moved a longer distance so that the wafer is properly implanted by the ion beam, also the weight of the wafer is correspondingly increased. For example, when the beam height of the ion beam is fixed at H and the wafer thickness is fixed, to ensure uniform implantation over whole the wafer, the required minimum movement distance of a wafer with diameter R along the beam height direction is the difference between R and H, R−H, but the required movement distance of a larger wafer with diameter 2R along the beam height direction is the difference between 2R and H, i.e. 2R−H. Clearly, the former has to move a wafer and its support structure having a weight W along a distance (R−H), but the latter has to move a wafer and its support structure having a larger weight ~4W a larger distance (2R−H). Undoubtedly, the required energy to move the wafer is increased, even the hardware cost and the operation complexity of the mechanism for moving the wafer are correspondingly increased. Such disadvantages are more serious for the next generation that the wafer diameter is about 450 mm (or viewed as about 18 inches).

Of course, a solution is to increase the beam height of the ion beam, especially the size of the uniform portion of the ion beam. Thus, the required movement distance of the wafer can be decreased, even may be zero if the beam height is larger than the wafer diameter. Nevertheless, to increase the beam height of ion beam usually means higher hardware cost and higher operation complexity of the ion implanter, also may decrease the uniformity of the ion beam. These disadvantages are more serious for the next generation that the wafer diameter is about 450 mm (or viewed as about 18 inches). Besides, for some special cases, such as the wafer has different dose regions having individual doses even different shapes/sizes/doping-depth, a spot ion beam or a shorter ribbon ion beam may be convenient and useful.

Another solution is moving the wafer only along the beam width direction but moving the ion beam along the beam height direction, and one another solution is fixing the wafer but moving the ion beam along both the beam height direction and the beam width direction. Thus, the disadvantages described previously may be avoided because the wafer is not moved along the beam height direction now. Nevertheless, when the ion beam is swung over the wafer, the incident angle between the implanted ion beam and the surface of the wafer varies among different portions of the wafer. In such situation, it is difficult to precisely control the properties of the implantation on the wafer, also the distribution of implanted ions inside the wafer will be non-uniform over different portions of the wafer. Hence, even the moving speed of the ion beam is uniformly over the wafer and the beam current of the ion beam is continuously stable during the period of scanning the ion beam over the wafer, the implantation result over the wafer is still not precisely controlled and non-uniform. As usual, one or more additional step(s) and/or additional device(s) are required to precisely control the implantation on the wafer. For example, a mask having an aperture is moved with the ion beam simultaneously, where the shape and the size of the aperture is essentially equal to that of a projected area of the ion beam on the wafer when the ion beam is vertically implanted into the wafer. Thus, when the ion beam is not vertically implanted into the wafer, the edge portion of the ion beam is filtered out by the aperture and only the center portion of the ion beam is implanted to the wafer. In addition, to keep the center portion of the ion beam fixed for different incident angles, it is an option to use a mask having an adjustable aperture. Nevertheless, the usage of the mask unavoidably increases the hardware cost and the operation complexity, especially the usage of the mask having adjustable aperture.

According to the above discussions, there is a need to propose a novel ion implanter and a novel ion implant method to implant a wafer.

SUMMARY OF THE INVENTION

The present invention provides a new approach to implant a wafer. According to a feature of the invention, the traditional two-dimensional movement of a wafer may be replaced by a combination of the movement of the wafer and the movement of an aperture mechanism having an aperture configured to filter an ion beam before the wafer is implanted by the filtered ion beam.

Reasonably, when the aperture is moved along the long direction (i.e., the beam height direction) of a uniform large ribbon beam and the wafer is moved along another direction intersecting the long direction (such as the beam width direction), especially when the shape/size of the aperture is similar to the shape/size of a traditional spot beam, the combination of the aperture movement and the wafer movement may behave as the traditional two-dimensional wafer scan, even the ion beam is a ribbon ion beam. The wafer movement and the aperture movement can be processed alternatively, processed simultaneously, or be processed with any flexible order. In such situation, even a ribbon beam is provided, the practical implantation over the wafer still may be similar to the implantation of a spot beam, because the aperture allows only a portion of the ribbon ion beam, which usually is a uniform portion of the ribbon ion beam, to be implanted into the wafer.

Note that this feature is independent on whether the beam is fixed or the ion beam is swung during the period of moving the wafer across the ion beam. The only requirement is that the ion beam can be filtered by the aperture during this period.

Additionally, the ion beam may be fixed when the wafer is moved. Thus, the disadvantages induced by different incident angles over different portions of the wafer may be improved. Also, the area of the aperture may be significantly smaller than the cross-sectional area of the ion beam. Thus, the implantation over the wafer may be flexibly adjusted by changing the used portions of the ion beam by adjusting the aperture size and shape during the implantation period.

One embodiment is an ion implant method. Initially, provide a wafer, a ribbon ion beam and an aperture apparatus having an aperture. Next, filter the ribbon ion beam by using the aperture apparatus so that the wafer is implanted by partial ribbon ion beam passing through the aperture. Then, use both the wafer movement and the aperture movement to achieve a two-dimensional wafer scan. In general, the shape and the size of said aperture is controlled to be similar to the shape and the size of a spot ion beam. In general, the wafer is moved along the short direction of the ribbon ion beam and the aperture is moved along the long direction of the ribbon ion beam alternatively, but also may be simultaneously. In general, for each movement of the aperture, the movement distance of the aperture along the long direction of the ribbon ion beam is not larger than the size of the aperture along the long direction of the ribbon ion beam for each movement of said aperture.

Another embodiment also is an ion implant method. Initially, provide a wafer, an ion beam, and an aperture mechanism having an aperture configured to filter the ion beam before implanting the wafer. Next, move the wafer along a first direction and the aperture mechanism along a second direction intersecting the first direction separately, such that a projected area of the filtered ion beam is two-dimensionally scanned over the wafer. Wherein, at least one of the following is performed: (1) control the movement direction of the wafer so that the incident angle between the wafer and the ion beam is fixed during a period of moving the wafer across the ion beam; and (2) keep the area of the aperture significantly smaller than the cross-sectional area of the ion beam during a period of moving the aperture across the ion beam.

The other embodiment is an ion implanter. The ion implanter includes an ion beam assembly, a wafer moving mechanism, an aperture mechanism and an aperture moving mechanism. The ion beam assembly is configured to generate an ion beam, the wafer moving mechanism configured to move a wafer along a first direction, the aperture mechanism has an aperture configured to filter the ion beam before the wafer is implanted by the filtered ion beam, and the aperture moving mechanism configured to move the aperture mechanism along a second direction intersecting the first direction. Wherein the movement direction of the wafer is vertical to the ion beam so that the incident angle between the wafer and the ion beam is fixed, i.e., the incident angle is the same between different portions of the implanted wafer, during a period of moving the wafer across the ion beam. Thus, a projected area of the filtered ion beam is two-dimensionally scanned over the wafer when the wafer and the aperture mechanism are moved along the first and the second directions separately.

One more embodiment is an ion implanter. The ion implanter also includes an ion beam assembly, a wafer moving mechanism, an aperture mechanism and an aperture moving mechanism. The functions of these elements of the ion implanter are similar with the above embodiments, except the two points: (1) the area of the aperture is adjustable during a period of moving the aperture mechanism across the ion beam, or between any periods of moving the aperture mechanism across the ion beam; and (2) the ion beam may be not fixed during the period of moving the wafer across the ion beam.

BRIEF DESCRIPTION OF THE DRAWINGS

FIG. 6A to FIG. 6G show steps as an example of the method depicted in FIG. 3C.

DETAILED DESCRIPTION OF THE INVENTION

A detailed description of the present invention will be discussed in connection with the following embodiments, which are intended not to limit the scope of the present invention but rather to be adaptable for other applications. While the drawings are illustrated in detail, it is appreciated that the quantity of the disclosed components may be greater or less than that disclosed except for instances expressly restricting such components.

Figure 1A:
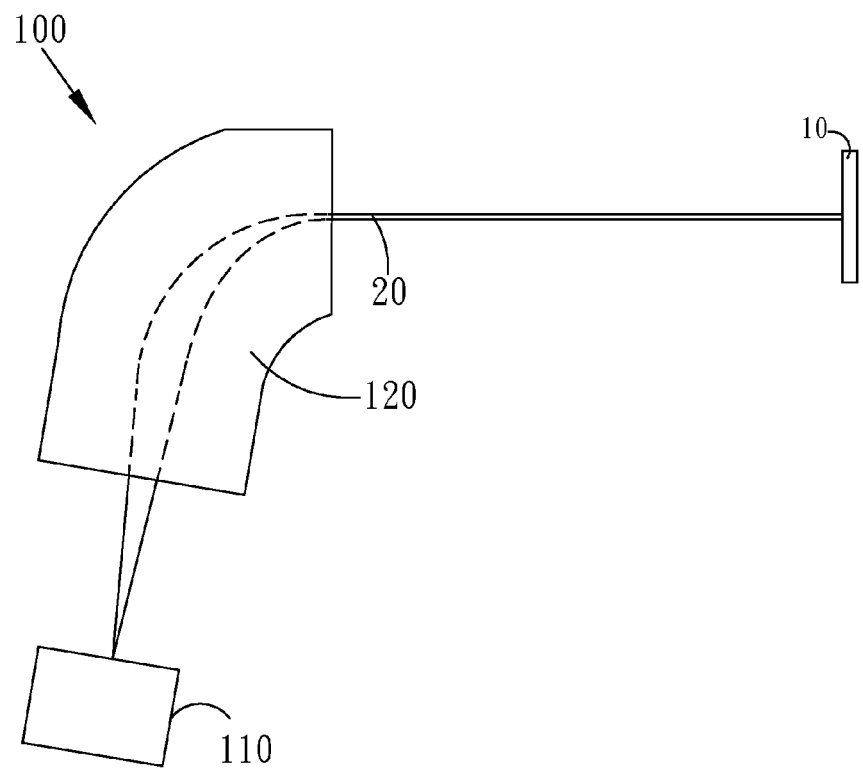
FIG. 1A is a simplified diagram of a traditional ion implanter.
Figure 1B:
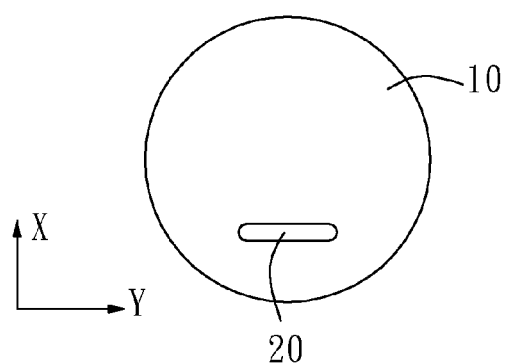
FIG. 1B shows a top view of the wafer depicted in FIG. 1A.
Figure 2A:
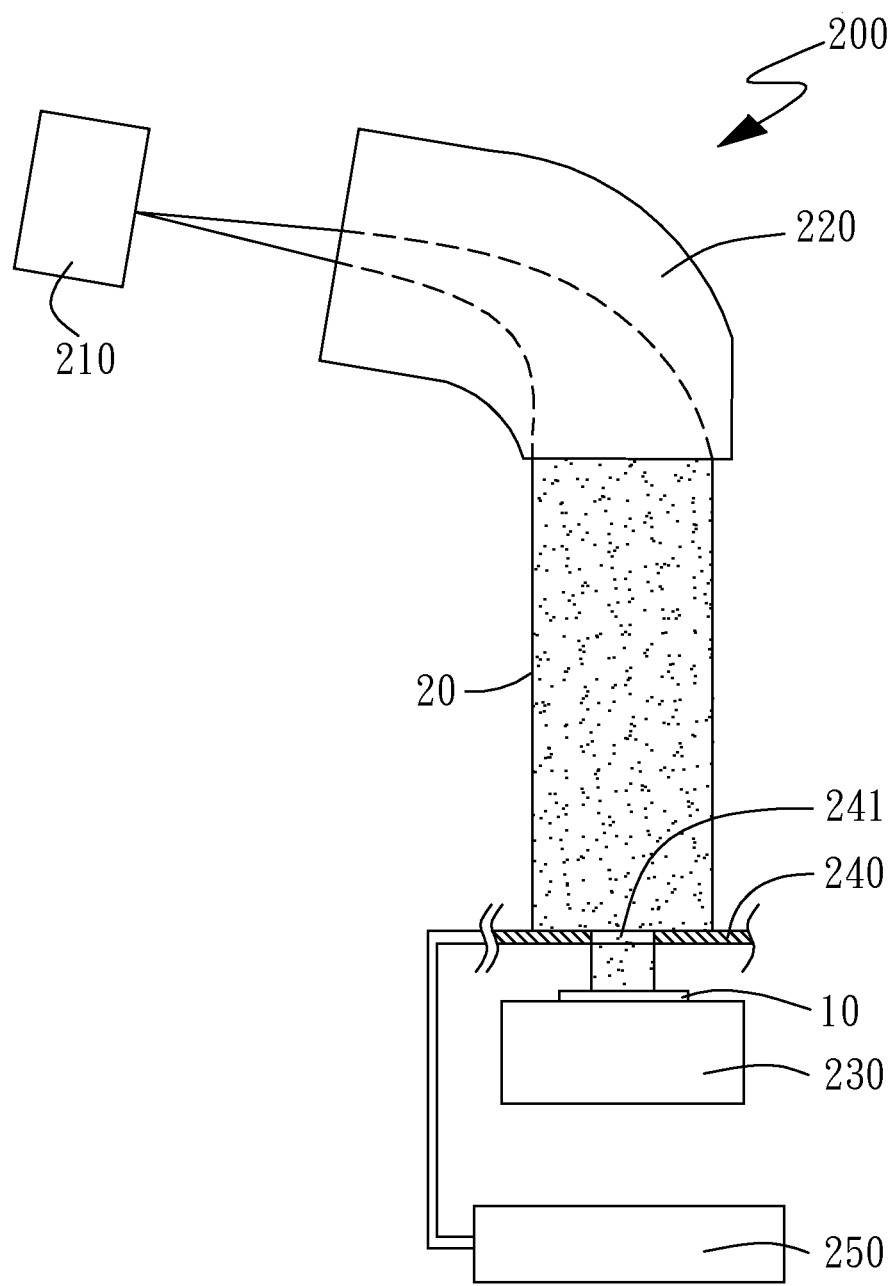
FIG. 2A is a sectional view of an ion implanter with an aperture mechanism in accordance with an embodiment of the present invention.

FIG. 2A is a sectional view of an ion implanter 200 in accordance with an inventive embodiment of the present invention. The ion implanter 200 includes at least an ion source 210, an analyze magnet 220, a wafer moving mechanism (e.g., advancer) 230, an aperture mechanism (e.g., panel) 240, and an aperture moving mechanism (e.g., advancer) 250. The ion source 210 is configured to generate an ion beam, and the analyze magnet 220 is configured to filter out ions without desired kinds/energies from the ion beam 20. As usual, although not particularly illustrated, some electrodes and some magnets are positioned between the analyze magnet 120 and the wafer 10 to accelerate/decelerate the ion beam, deform/shape the ion beam, and/or to modify other properties of the ion beam before the wafer being implanted. A combination of both the ion source 210 and the analyze magnet 220, even the combination including these electrodes and/or magnets, can be regarded as an ion beam assembly, because their function is generating the ion beam to be implanted into the wafer. The aperture mechanism 240 has an aperture 241 which is configured to filter the ion beam and to allow only a portion of the ion beam being implanted into the wafer 10. Moreover, the wafer moving mechanism 230 and the aperture moving mechanism 250 are configured to move the wafer 10 and the aperture mechanism 240 along different directions separately. Note that the embodiment is not intended to particularly limit the details of the wafer moving mechanism 230 and the aperture moving mechanism 250, except for limiting their functions. Hence, FIG. 2A shows only their existence without providing particular details such as their positions or sizes.

Figure 2B:
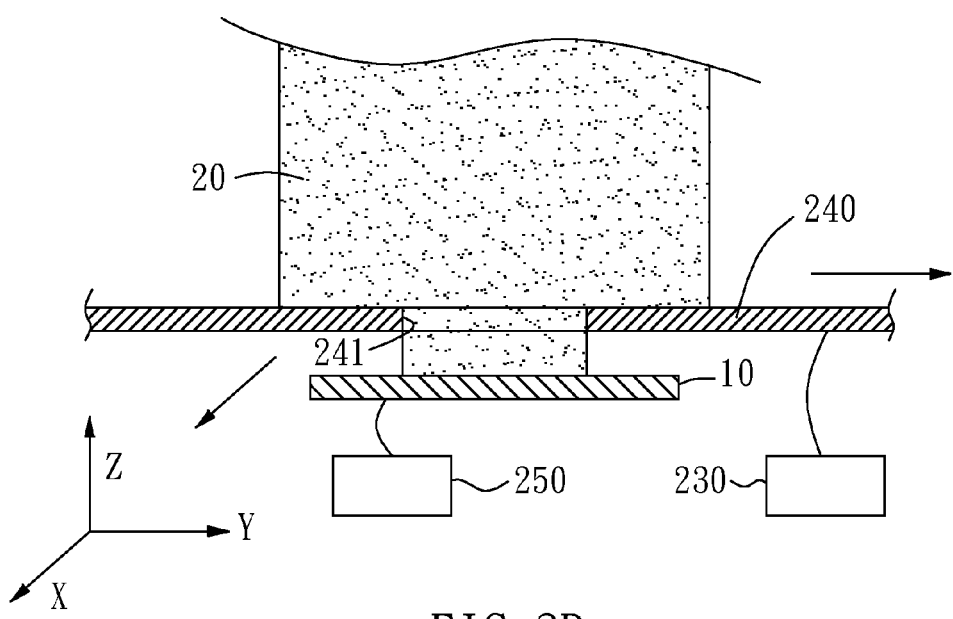
FIG. 2B and FIG. 2C show sectional and top views respectively of the aperture mechanism depicted in FIG. 2A.
Figure 2C:
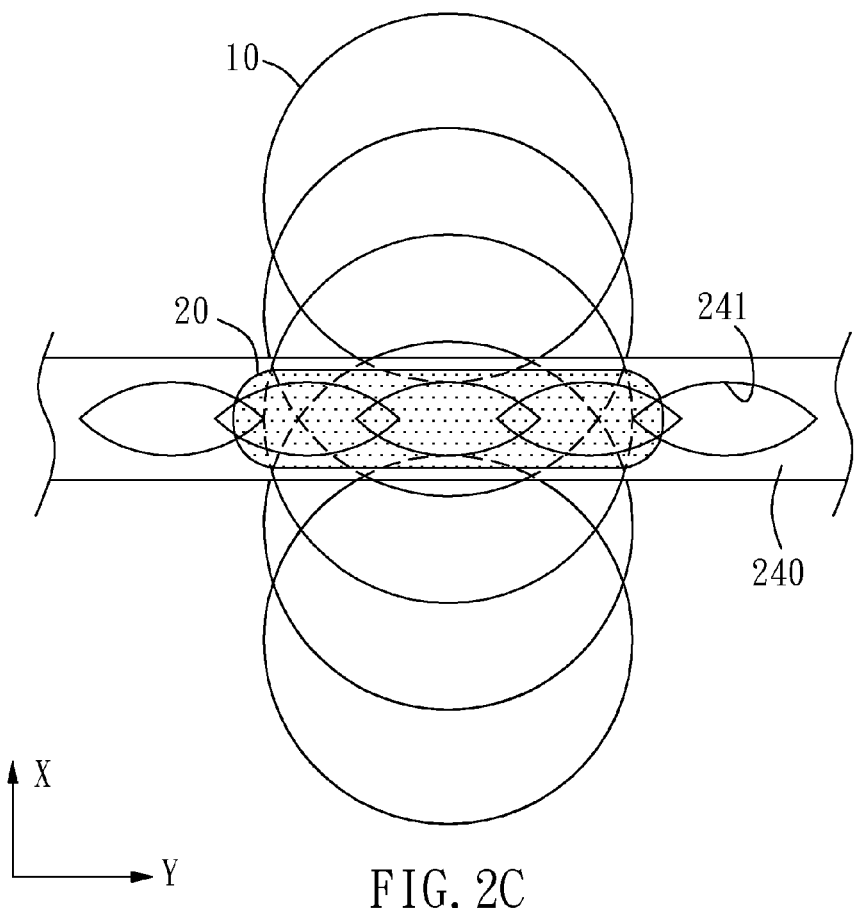

FIG. 2B and FIG. 2C show sectional and top views of the operation of the aperture mechanism 240 depicted in FIG. 2A respectively. The X-axis, the Y-axis and the Z-axis are perpendicular to each other. The wafer moving mechanism 230 is configured to move the wafer 10 across the ion beam 20 along the X-axis. The aperture moving mechanism 250 is configured to move the aperture mechanism 240 so that the aperture 241 is moved across the ion beam 20 along the Y-axis. The ion beam path of the ion beam 20 is fixed along the Z-axis, at least partial ion beam path proximate to both the wafer 10 and the aperture 241 is fixed along the Z-axis. Accordingly, the projected area of the ion beam 20 may be two-dimensionally scanned over the wafer 10 by using both the movements of the wafer 10 and the movement of the aperture 241 (e.g. the movement of the aperture mechanism 240). Note that the embodiment is not intended to particularly limit the details of the ion beam 20 and the aperture 241, except for limiting their relative relations. Hence, FIG. 2B and FIG. 2C show only their existence without particularly limiting their details, such as their shapes or sizes.

Reasonably, by using both the aperture movement and the wafer movement, the implantation result over a wafer achieved by the traditional 2D wafer scan may be equivalently achieved. Initially, filter a ribbon ion beam by the aperture mechanism so that only a special portion of the ribbon ion beam may pass through the aperture. In other words, a spot ion beam may be generated by using the aperture to filter the ribbon ion beam, i.e., a spot ion beam may be used to implant the wafer even the ion beam assembly still continuously generate a ribbon ion beam. Next, move the wafer across the ion beam (along the beam width direction) so that a first portion of the wafer is implanted by the spot ion beam (e.g. the special portion of the ribbon ion beam pass through the aperture). After that, move the aperture along the ion beam (along the beam height direction) so that another special portion of the ribbon ion beam may be implanted as another spot ion beam. Of course, if the ribbon ion beam has a larger uniform portion, the two spot ion beams may behave as the same spot ion beam but at different positions relative to the wafer. Then, move the wafer across the ion beam (along the beam width direction) again so that a second portion of the wafer is implanted by another spot ion beam. Reasonably, by repeating the step of moving wafer across the ion beam and the step of moving the aperture along the ion beam, the implantation over the wafer (at least a required dose region on the wafer) may be viewed as using a spot ion beam to implant the wafer (at least a required dose region on the wafer) through a two-dimensional wafer scan.

Undoubtedly, when the height of the required dose region on the wafer is equal or lower than the beam height of the ribbon ion beam, or at least is not larger than the height of the uniform portion of the ribbon ion beam, the 2D wafer scan can be achieved by only both the wafer movement and the aperture movement, in other words, the wafer never is moved along the ribbon ion beam (along the beam height direction). The advantage(s) is clear, because the hardware and the operation used to move the wafer along the beam height direction is replaced by the hardware and the operation used to move the aperture mechanism along the beam height direction. Because function of the aperture mechanism essential is only providing an aperture, it essentially may be only a plate with a hole (e.g. an aperture), at most some movable plates to form a variable aperture. Therefore, to compare with the required hardware/operation to move a heavy wafer support assembly (e.g. with tilt and twist mechanism plus cooling or heating mechanism), the required hardware/operation to move an aperture mechanism may be very lost cost, low power consumption, less operation complexity, less maintenance requirement, and so on. Significantly, when the wafer diameter will be about 450 mm (or 18 inches) for the next generation, the advantage will be more significantly because the increment of the wafer weight is faster than the increment of the wafer diameter.

The advantages may be effectively emphasized by comparing with these prior arts discussed above. For one kind of the prior arts, the wafer is moved on a plane vertical to the ion beam, i.e., the plane is defined by both the beam height direction and the beam width direction. In contrast, in the inventive embodiment, the wafer is moved along the beam width direction (X-axis) and the aperture 241 (or viewed as the aperture mechanism 240) is moved along the beam height direction (Y-axis) respectively. The size of the aperture mechanism 240 may be only briefly larger than the cross-section of the ion beam 20 because the size of aperture 241 is smaller than the cross-section of the ion beam 20. The structure of the aperture mechanism 240 may be very simple with less weight because it is only configured to provide the aperture 241 and to block out a portion of the ion beam 20 when other portion of ion beam 20 pass through the aperture 241. Hence, the aperture moving mechanism 230 for moving the aperture mechanism 240 (or viewed as the aperture 241) along the beam height direction (Y-axis) may be significantly simpler, even cheaper and less power consumption, than that of the mechanism for moving the wafer 10 along the beam height direction for this kind of the prior arts.

For another kind of the prior arts, the ion beam is moved (e.g., swung) on a plane vertical to the ion beam direction (Z-axis), i.e., the plane is defined by both the beam height direction and the beam width direction. Clearly, the incident angle between the ion beam 20 and the wafer 10 is varied among different portions of the implanted wafer due to ion beam moving across the wafer, and then the distribution of the implanted ions inside the implanted wafer is non-uniform over the implanted wafer. Moreover, the cost and the operation of the required hardware for two-dimensionally moving (swing) the ion beam is unavoidable. In contrast, in the inventive embodiment, the ion beam 10 is fixed along the Z-axis but both the wafer 10 and the aperture mechanism 240 (or the aperture 241) are moved along different direction respectively. Hence, the incident angle may be un-changed over the implanted wafer, the hardware and the operation for two-dimensionally moving the ion beam are avoided.

For the other kind of the prior arts, the wafer and the ion beam are moved along different direction on the plane vertical to the ion beam (the Z-axis) respectively, also a mask with a fixed aperture is configured to be moved with the ion beam simultaneously (the shape and the size of the aperture is essentially equal to that of the cross section of the ion beam). Thus, the disadvantages of the other two kinds of the prior arts may be decreased, even avoided, because the ion beam and the wafer are moved respectively, also variance of the incident angle over different portions of the implanted wafer may be reduced because the mask may filter out the edge portion of the ion beam and only allow the center portion of the ion beam being implanted into the wafer. However, the moving mask induces an extra cost, and how to coordinate the motion of the mask and the motion of the ion beam induces technical challenges. Further, even the mask is used, the divergence of the ion beam induced by the motion of the ion beam, such as swing the ion beam backward and forward, is still exist and then the spatial distribution of implanted ions will be still varied among different portions of the implanted wafer. In contrast, in the inventive embodiment, the ion beam path is fixed (at least the ion beam path proximate to the wafer 10 is fixed) and the movement of the wafer 10 is controlled to ensure the incident angle between the wafer 10 and the ion beam 20 is fixed. In this way, the divergence of the ion beam 20 can be automatically avoided so that the spatial distribution of implanted ions is the same among different portions of the wafer 10. Besides, in this inventive embodiment, the motion of the aperture mechanism 240 is independent on the motion of the ion beam 20 (indeed, the ion beam is fixed). Also, in this inventive embodiment, the size of the aperture 241 is not limited to be briefly equal to that of the cross-section of the ion beam 20, and then the size/shape of the aperture 241 may be flexibly adjusted to pass a special portion of the ion beam 20 but not always passes whole the ion beam 20 or whole the center portion of the ion beam 20 as described in this kind of prior art. Therefore, the operation of the aperture mechanism 240 may be simpler than that of the mask, and the aperture mechanism 240 may be used to flexibly and/or non-uniformly implant the wafer 10.

Furthermore, the proposed invention may have other inventive embodiments. For example, the size and the shape of the aperture may be similar to the traditional spot beam, so that a traditional two-dimensionally wafer scan may be achieved by using such aperture to filter a ribbon ion beam. But, when the aperture may filter the ion beam, indeed, the proposed invention does not limit the variations of both the size and the shape of the aperture. For some variations, the area of the aperture is significantly smaller than the cross-sectional area of the ribbon ion beam, at least during the period of moving the aperture across the ribbon ion beam. For some variations, the area of the aperture is brief equal to the cross-sectional area of the ribbon ion beam, or at least is brief equal to the cross-sectional area of the ribbon ion beam. For some variations, the area of the aperture is adjustable, even is adjustable during the period of moving the aperture across the ribbon ion beam to generate uniform or non-uniform dose distribution on the wafer.

Also, although a ribbon ion beam is used in the previous inventive embodiments, the feature of filtering an ion beam by the aperture is not limited so. For some variations, the ion beam may be a traditional spot ion beam, and then the area of the aperture is smaller than that of the traditional spot ion beam. For some variations, the ion beam may be only a briefly tuned ion beam with non-uniform ion beam current distribution, and then the aperture is used to only pass a bit of uniform portion of the ion beam into the wafer to be implanted.

Besides, the characteristic "fixed ion beam" is proposed to fix the incident angle between the wafer and the ion beam, especially the filtered ion beam. Hence, an optional variation of this characteristic is controlling the motion of the wafer, such as the tilt of the wafer, so that the incident angle is fixed during a period of moving the wafer across the ion beam. In this optional variation, whether the ion beam is fixed or the ion beam path is fixed is not limited, but the relative geometric relation between the ion beam and the wafer, especial the implanted surface of the wafer, is limited to keep the incident angle as a constant during the period of moving the wafer across the ion beam.

It should be noticed that the limitation of "ribbon ion beam," the limitation of "fixed ion beam" and the limitation of "smaller aperture than the cross section of the ion beam" are independent on each other. The ribbon ion beam may be provided by adjusting the operation of the ion beam assembly, the fixed ion beam may be provided by fixing the operation of the ion beam assembly and/or by adjusting the operation of the aperture moving mechanism, and the smaller aperture may be provided by adjusting the aperture mechanism and/or by using different aperture mechanism. Therefore, for different inventive embodiments, it is optional to have one and only one such limitation, any two of the three limitations, or all of the three limitations.

Although FIG. 2A to FIG. 2C show the situation where the movement direction of the wafer 10 is perpendicular to the movement direction of the aperture 241, the invention need not be limited so. Indeed, the only requirement is that the wafer 10 and the aperture 241 can be moved along different directions.

Further, it is optional that the wafer 10 is moved with a first velocity and the aperture mechanism 240 is moved with a second velocity. Herein, the first velocity is independent on the second velocity, and both the first velocity and the second velocity are adjustable. Therefore, the projected area of the filtered ion beam may be scanned through different portions of the wafer 10 with different velocities. When a non-uniform implantation over the wafer 10 is required, or when different scan rate is an important factor of implantation over the wafer 10, the option is valuable.

Further, it is also optional that one or more of the scan path and the scan rate of the projected area of the ion beam 20 over the wafer 10 are adjustable. In other words, it is optional that one or more of the movement of the wafer 10 and the movement of the aperture 241 are adjustable, no matter the movement direction and/or the movement distance. Therefore, depending on the required dose distribution over the wafer 10, each of the scan path and the scan rate may be adjusted correspondingly.

Finally, the dose rate control of different portions of the wafer 10 can be achieved separately. As well known, different scan rates of the ion beam 20 through the projected area on different portions of the wafer 10 may induce different effects on the semiconductor structures formed in and on the wafer 10. Therefore, as discussed above, when the unique size of the projected area of the filtered ion beam 20 is smaller than the size of the ion beam 20, it is easy to adjust the dose rate effect over different portions of the wafer 10.

Typical, the calculation of the scan rate and the scan path, and/or even other scan parameters, is based on the assumption that the whole aperture 241 is filled by the ion beam 20 and the whole filtered (i.e., passing through the aperture 241) ion beam is implanted into the wafer 10. The assumption almost is correct when the aperture 241 is located over the wafer 10. Nevertheless, when the aperture 241 is located nearby the ends of the cross-section of the ion beam 20, the aperture 241 may not be completely filled by the ion beam. Also, when the aperture 241 is located near the edge of the wafer 10, the filtered ion beam passing through the aperture 241 may not be completely projected onto the wafer 10. In such case, it is desired to correct the scan path and the scan rate, and/or even other scan parameters, according to the real ion beam passing through the aperture 241 and arriving on the wafer 10, to thereby provide what usually is referred to as an "edge correction factor,"

Additionally, it is well-known that an aperture can be used to adjust the ion beam to be implanted into the wafer, wherein the aperture has a fixed shape and is located in a fixed position. Hence, details of the aperture 241 are omitted herein, except for main characteristics being briefly introduced. For example, a shape of the aperture 241 may be adjusted to ensure a beam current distribution of a filtered ion beam 20 dropping to zero gradually at the edge of the aperture 241, or to ensure a current distribution of the filtered ion beam 20 having a Gaussian distribution. As may be typical, the shape of aperture 241 may comprise one or more (e.g., combination or complex shape) of a circle, oval, ellipse and diamond. Also, the material of the aperture mechanism 240, especially the material of partial aperture mechanism 240 proximate to the aperture 241, may be graphite to minimize the possible pollution induced by collision with the ion beam 20. Besides, to further minimize possible pollution, a shield configured to prevent the aperture moving mechanism 250 from being implanted by the ion beam 20 optionally is implemented. According to non-illustrated embodiment(s), the shield is made of graphite and located upstream and close to the aperture mechanism 240 for covering most of the aperture mechanism 240 and exposing essentially only the aperture 241.

Figure 3A:
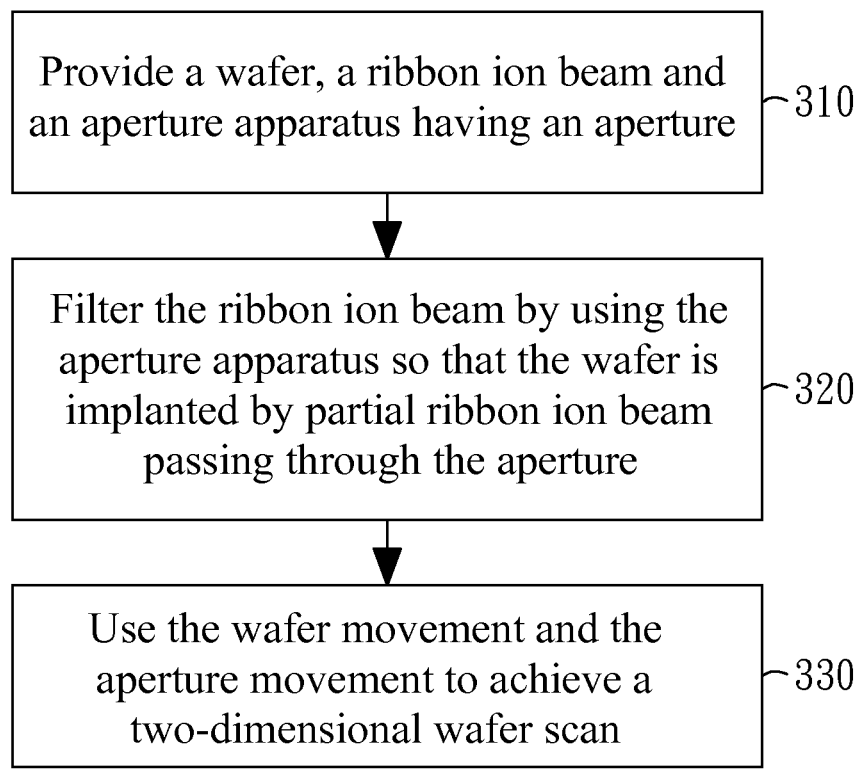
FIG. 3A to FIG. 3C respectively show the flow diagram of the ion implant method in accordance with three embodiments of the present invention.
Figure 3B:
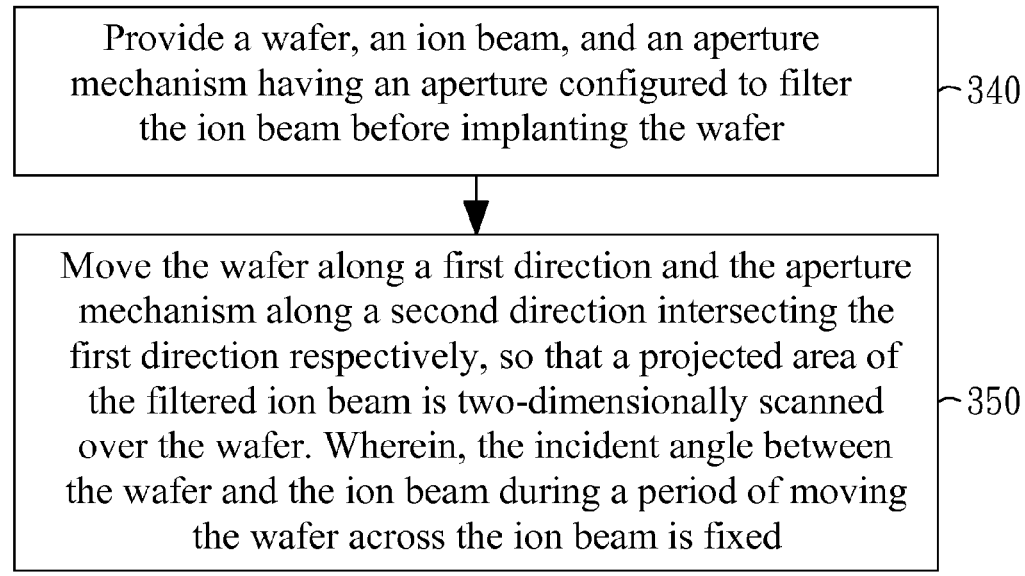
Figure 3C:
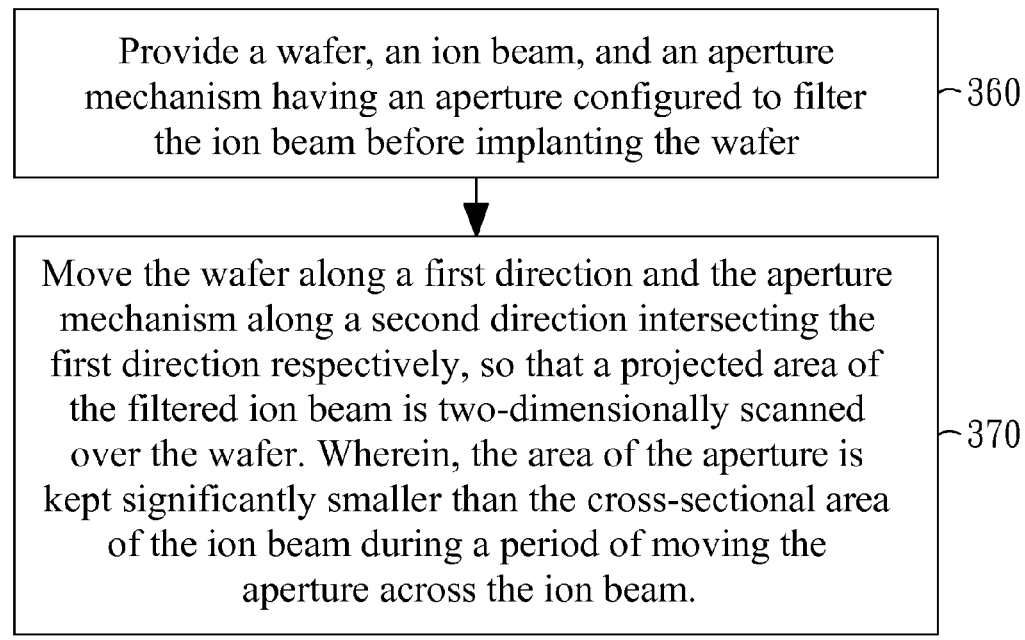

FIG. 3A, FIG. 3B and FIG. 3C respectively show the flow diagram of the ion implant method in accordance with three embodiments of the present invention. The three embodiments are based on the above discussions, and then the related descriptions are simplified, even omitted, hereto. As shown on FIG. 3A, one ion implant method includes a step 310 that provide a wafer, a ribbon ion beam and an aperture apparatus having an aperture, a step 320 that filter the ribbon ion beam by using the aperture apparatus so that the wafer is implanted by partial ribbon ion beam passing through the aperture, and a step 330 that use the wafer movement and the aperture movement to achieve a two-dimensional wafer scan. As shown in FIG. 3B, another ion implant method includes a step 340 that provide a wafer, an ion beam, and an aperture mechanism having an aperture configured to filter the ion beam before implanting the wafer, and a step 350 that move the wafer along a first direction and the aperture mechanism along a second direction intersecting the first direction respectively, so that a projected area of the filtered ion beam is two-dimensionally scanned over the wafer. Wherein, the incident angle between the wafer and the ion beam during a period of moving the wafer across the ion beam is fixed. As shown in FIG. 3C, the other ion implant method includes a step 360 that provide a wafer, an ion beam, and an aperture mechanism having an aperture configured to filter the ion beam before implanting the wafer, and a step 370 that move the wafer along a first direction and the aperture mechanism along a second direction intersecting the first direction respectively, so that a projected area of the filtered ion beam is two-dimensionally scanned over the wafer. Wherein, the area of the aperture is kept significantly smaller than the cross-sectional area of the ion beam during a period of moving the aperture across the ion beam. The area of the aperture is also adjustable during the wafer motion, or during the aperture motion to produce specific dose distribution.

The practical details and the advantages of the first ion implant method are discussed below with reference to FIGS. 4A-4J.

Figure 4A:
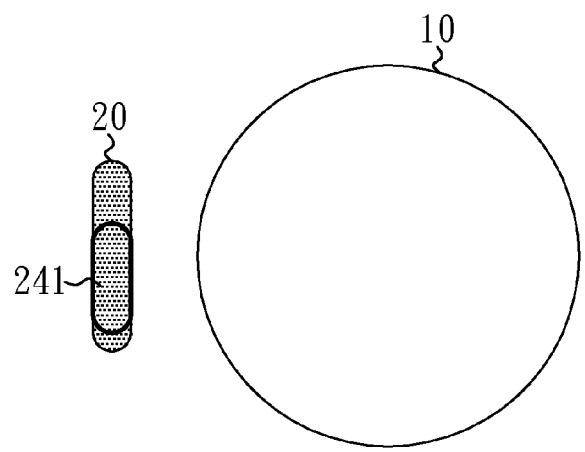
FIG. 4A to FIG. 4E show steps as an example of the method depicted in FIG. 3A.

Initially, as shown on FIG. 4A, the aperture 241 is overlapped with a first portion of the ion beam 20, and the wafer 10 is located on one side of the ion beam 20. The ion beam 20 is a ribbon ion beam and the size of the aperture 241 is similar to a traditional spot ion beam. For example, when the wafer diameter is 300 mm, the height of the aperture 241 is about 150~200 mm. Also, the width of the aperture 241 is the same or just smaller than the width of the ion beam 20. Practically, the aperture width can be larger than the beam width too to give similar effect as the aperture width is the same as the beam width since the filtered beam width will not changed when the aperture width is larger than the beam width.

Figure 4B:
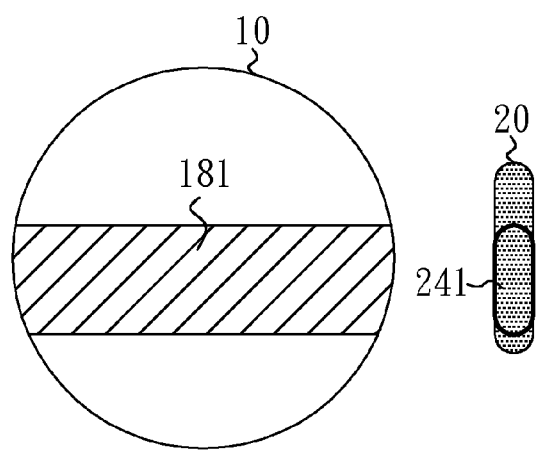

Next, as shown on FIG. 4B, the wafer 10 is moved along the beam width direction (i.e., the short direction) to the left side of the ion beam 20. During the period of moving the wafer 10 across the ion beam 20, a first portion 181 of the wafer 10 is implanted by partial ion beam 20 passing through the aperture 241.

Figure 4C:
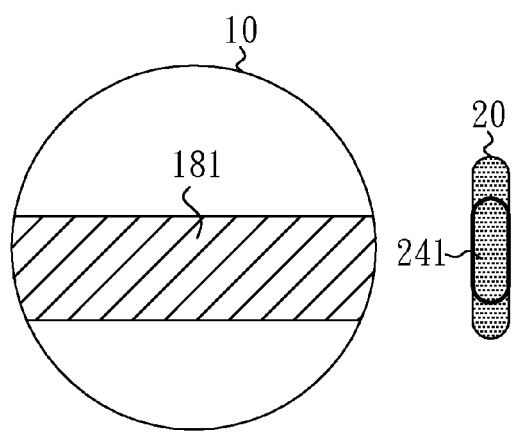

Then, as shown on FIG. 4C, the wafer 10 is fixed but the aperture 241 is moved along the beam height direction (i.e., the long direction) of the ion beam 20 a movement distance. As usual, to ensure proper implantation and to minimize the risk that partial wafer is not implanted and has an obvious lower dose, the movement distance is kept not larger than the size of the aperture 241 along the long direction of the ion beam 20. Indeed, the movement distance usually is small to increase the uniformity of implantation over all implanted portions of the wafer 10.

Figure 4D:
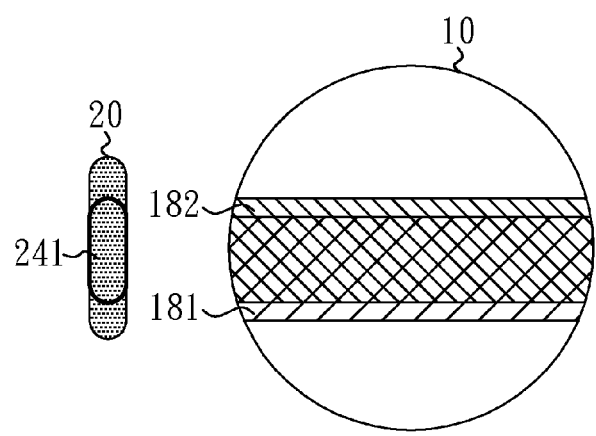

After that, as shown on FIG. 4D, the wafer 10 is moved along the beam width direction (i.e., the short direction) from the left side of the ion beam 20 to the right side of the ion beam 20. During the period of moving the wafer 10 across the ion beam 20, a second portion 182 of the wafer 10 is implanted by partial ion beam 20 passing through the aperture 241. Due to the movement of the aperture 241 as shown on FIG. 4C, the first portion 181 is different than the second portion 182, and the difference therebetween is proportional to the movement distance. The smaller the movement distance, the more the implantation uniformity over the first portion 181 and the second portion 182.

Figure 4E:
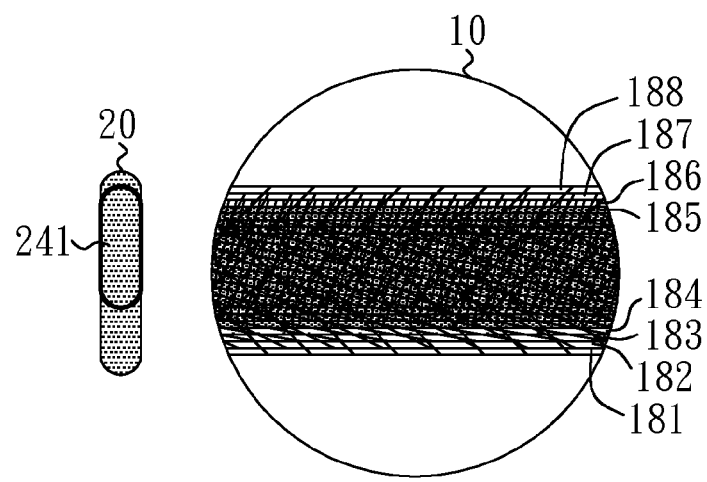

Reasonably, by repeating the steps discussed above, i.e., repeating the step of moving the wafer 10 across the ion beam 20 and the step of moving the aperture 241 along the ion beam 20 alternatively, at least partial wafer 10 is implanted. FIG. 4E shows a simplified situation that only eight portions 181~188 of the wafer 10 are implanted in sequence and movement distance is kept as one-tenth of the height of the aperture 241. Clearly, the combination of these portions 181~188 corresponds to the required dose region on the wafer 10. Of course, FIG. 4E is only an example, the invention may have less or more portions to be implanted during different periods of moving the wafer 10 across the ion beam 20, also the combination of these portions may be partial wafer 10 or the whole wafer 10 to create either uniform or non-uniform dose region on the wafer 10.

The traditional two-dimensional wafer scan is briefly discussed as below with reference to FIGS. 4F~4J.

Figure 4F:
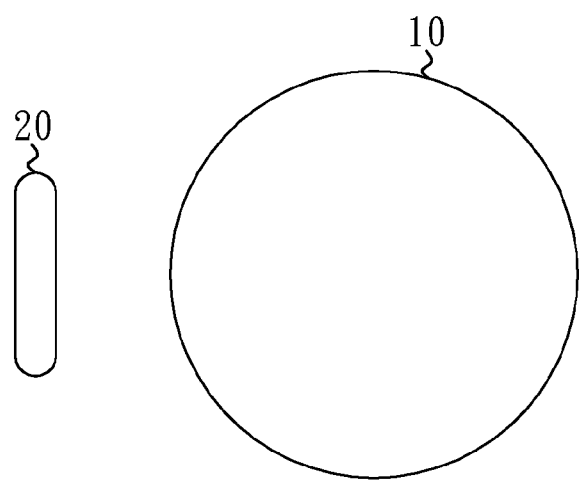
FIG. 4F to FIG. 4J show steps as the traditional two-dimensional wafer scan.

Initially, as shown on FIG. 4F, the wafer 10 is located on one side (on the right side in the figure) of the ion beam 20 when the ion beam is a traditional spot ion beam directly provided by the ion beam assembly. In other words, the ion beam 20 is not modified to be a spot ion beam from a ribbon ion beam.

Figure 4G:
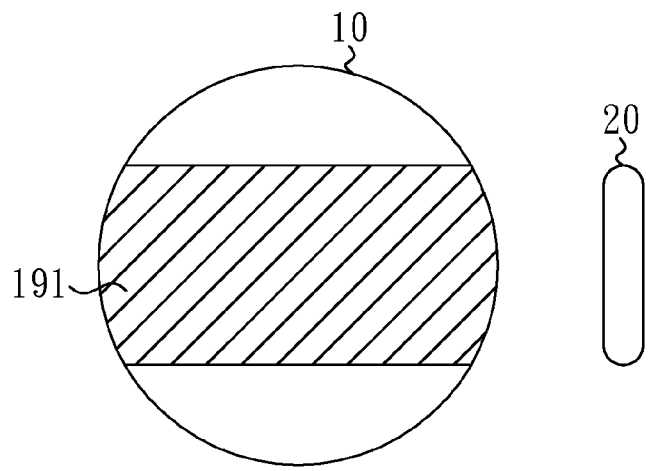

Next, as shown on FIG. 4G, the wafer 10 is moved along the beam width direction (i.e., the short direction) to the left side of the ion beam 20. During the period of moving the wafer 10 across the ion beam 20, a first portion 191 of the wafer 10 is implanted by partial ion beam 20 passing through the aperture 241.

Figure 4H:
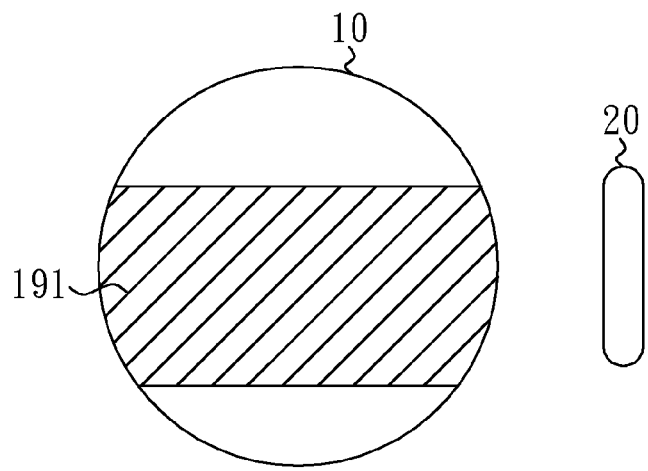

Then, as shown on FIG. 4H, the ion beam 20 is fixed but the wafer 10 is moved along the beam height direction (i.e., the long direction) of the ion beam 20 a movement distance. As usual, to ensure proper implantation and to minimize the risk that partial wafer is not implanted and has an obvious lower dose, the movement distance is kept not larger than the size of the spot ion beam (ion beam 20) along the long direction of the ion beam 20. Indeed, the movement distance usually is small to increase the uniformity of implantation over all implanted portions of the wafer 10.

Figure 4I:
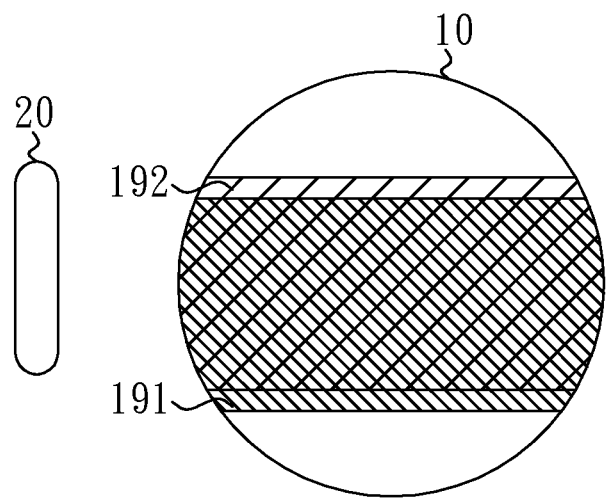

After that, as shown on FIG. 4I, the wafer 10 is moved along the beam width direction (i.e., the short direction) from the left side of the ion beam 20 to the right side of the ion beam 20. During the period of moving the wafer 10 across the ion beam 20, a second portion 192 of the wafer 10 is implanted by partial ion beam 20 passing through the aperture 241. Due to the movement of the aperture 241 as shown on FIG. 4H, the first portion 191 is different than the second portion 192, and the difference therebetween is proportional to the movement distance. The smaller the movement distance, the more the implantation uniformity over the first portion 191 and the second portion 192.

Figure 4J:
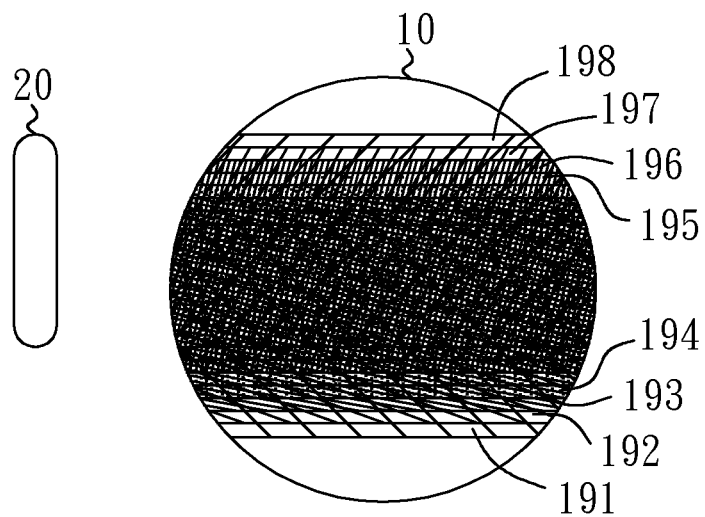

Reasonably, by repeating the steps discussed above, i.e., repeating the step of moving the wafer 10 across the ion beam 20 and the step of moving the wafer 10 along the ion beam 20 alternatively, at least partial wafer 10 is implanted. FIG. 4J shows a simplified situation that only eight portions 191~198 of the wafer 10 are implanted in sequence and movement distance is kept as one-tenth of the longer size of the ion beam 20. Clearly, the combination of these portions 191~198 corresponds to the required dose region on the wafer 10. Of course, FIG. 4J is only an example, the invention may have less or more portions to be implanted during different periods of moving the wafer 10 across the ion beam 20.

According to the above discussion, the implantation result over the wafer 10 may be similar, even be equivalent, no matter is achieved by using the present ion implant method or by using the traditional two-dimensional wafer scan. Nevertheless, the present ion implant method has a very significant advantage that the wafer 10 needed not to be moved along the ion beam 20. Hence, the required hardware/operation for moving wafer 10, even also moving a very heavy wafer motion mechanism which is proportional to the wafer, is replaced by the required hardware/operation for moving a much lighter aperture mechanism 240 which may be plates having holes (i.e., aperture 241). At most, the aperture moving mechanism 250 also is moved, but the aperture moving mechanism 250 is reasonably lighter and simpler because the aperture mechanism 240 is a much lighter hardware. Reasonably, the present ion implant method may use simpler and lighter hardware, further may reduce power consumption, may simplify the operation, and may reduce potential mechanical particle pollution and/or other problems.

Note that FIG. 4A to FIG. 4E do not illustrate the situation that the height of the required dose region is larger than the beam height of the ion beam 20, or at least is larger than the height of the uniform portion of the ion beam 20. Under such situation, even the aperture 241 is moved along whole the ion beam 20 (or moved along the whole uniform portion of the ion beam 20), the required dose region still is not completely implanted. Hence, to cover the whole wafer, it may be desired to move the wafer 10 along the beam height, and the required movement distance of the wafer 10 is at least the difference between the height of the required dose region and the beam height of the ion beam 20 (or the difference between the height of the required dose region and the height of the uniform portion of the ion beam 20).

Note that FIG. 4F to FIG. 4J do not illustrate the situation that the height of the required dose region is equal to whole diameter of the wafer 10. Nevertheless, it is straightforward to continuously repeat the steps described about until the whole wafer 10 is implanted. Hence, to cover the whole wafer 10, it may be desired to move the wafer 10 along the long direction of the ion beam 20 (a spot ion beam), and the required movement distance of the wafer 10 is at least the difference between the height of the required dose region and the beam height of the ion beam 20 (or the difference between the height of the required dose region and the height of the uniform portion of the ion beam 20).

Reasonably, because the ion beam 20 is a ribbon ion beam having a larger beam height for FIG. 4A to FIG. 4F, and the ion beam 20 is a traditional spot ion beam having a smaller beam height for FIG. 4F to FIG. 4J, the invention still may reduce the required movement distance of the wafer 10 along the long direction of the ion beam 20 when the height of the required dose region is equal to whole diameter of the wafer 10 (or viewed as the height of the required dose region is larger than uniform portion of the ion beam 20). Hence, to compare with the traditional two-dimensional wafer scan using a traditional spot ion beam, the invention may have a less power consumption for moving the wafer along the beam height direction, even the invention may use a simpler hardware to move the wafer along the beam height direction because the required movement is shorter.

Besides, another advantage of the present ion implant method has higher operation flexibility of the ion implanter. Note that the aperture is used to filter a ribbon ion beam so that the implantation on the wafer may be similar with the implantation implanted by a traditional spot ion beam. Hence, an ion implanter having only one ion beam assembly configured to provide a ribbon ion beam may directly implant the wafer by only using the ribbon ion beam, but also may indirectly implant the wafer after the ribbon ion beam being filtered by the aperture so that the filtered ion beam is similar with a spot ion beam. Hence, by using the present ion implant method, an implanter may become a dual mode implanter by only simply using a movable aperture mechanism to movably filter the ion beam as discussed above.

Two practical examples for block 350/370 are briefly discussed below with reference to FIGS. 5A-5G and FIGS. 6A-6G separately. In the embodiments, the ion beam 20 is a ribbon ion beam, and the beam height is larger than the diameter of the wafer 10. However, other non-illustrated embodiments may use a spot ion beam or a ribbon ion beam whose beam height is shorter than the diameter of the wafer.

Of course, once the wafer diameter is larger than the ion beam height, an additional step of moving the wafer 10 and/or the beam 20 in a direction of the long axis of the ion beam may be included to ensure proper implantation of the whole wafer 10. Herein, the additional movement of the wafer 10 or the ion beam 20 is used only to change the relative geometric relation between the wafer 10 and the ion beam 20 rather than alter the essential mechanism of these embodiments.

Figure 5A:
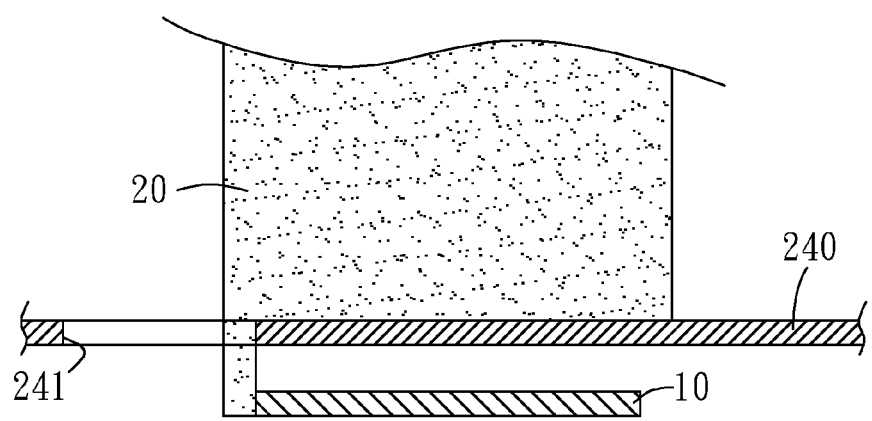
FIG. 5A to FIG. 5G show steps as an example of the method depicted in FIG. 3B.
Figure 5B:
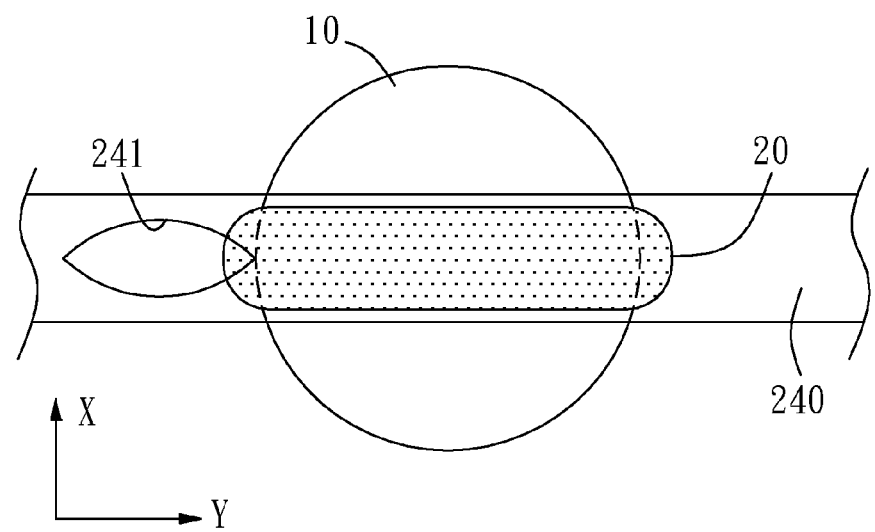

Referring to FIG. 5A and FIG. 5B, the aperture 241 is located in a first position of the Y-axis, and the wafer 10 is located on one side of the aperture 241 along the X-axis.

Here, as examples, the height of the ribbon beam is 350 mm if the wafer 10 is a 300 mm wafer, the non-uniformity of the ribbon beam is about 5% and usually not less than 1%, and the aperture 241 has an oval shape or diamond shape. To ensure that the current density of the ion beam 20 has a Gaussian distribution, the lengthwise dimension L of the aperture 241 is about 150 mm, and the lateral dimension W of the aperture 241 is about 60 mm.

Figure 5C:
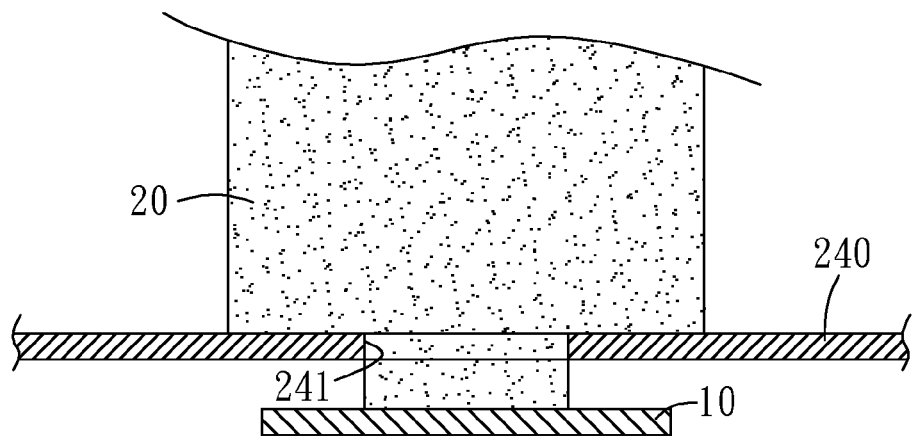
Figure 5D:
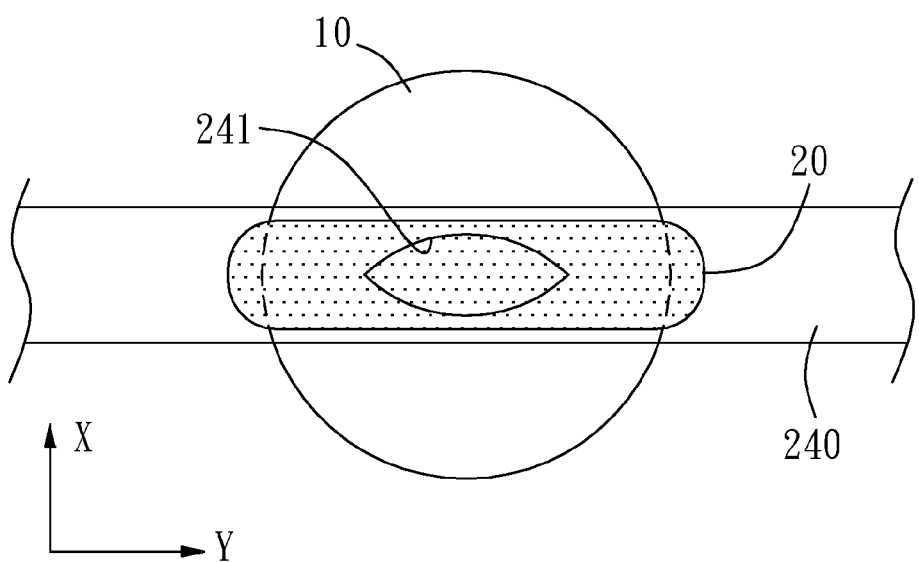
Figure 5E:
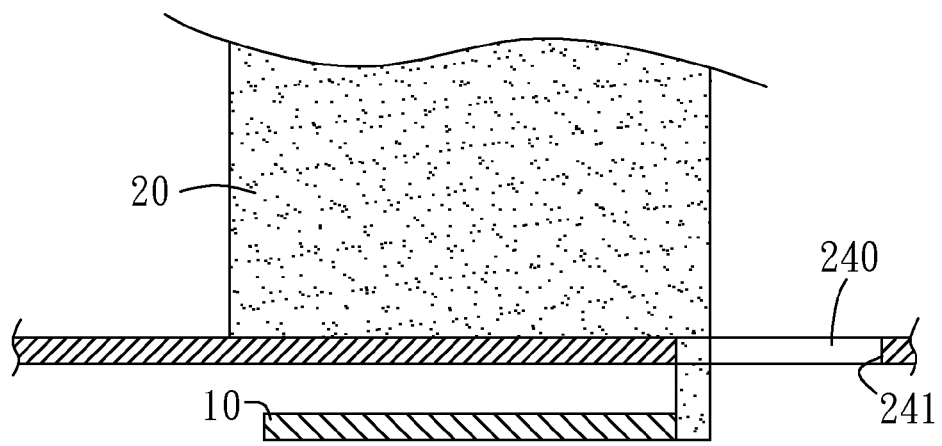
Figure 5F:
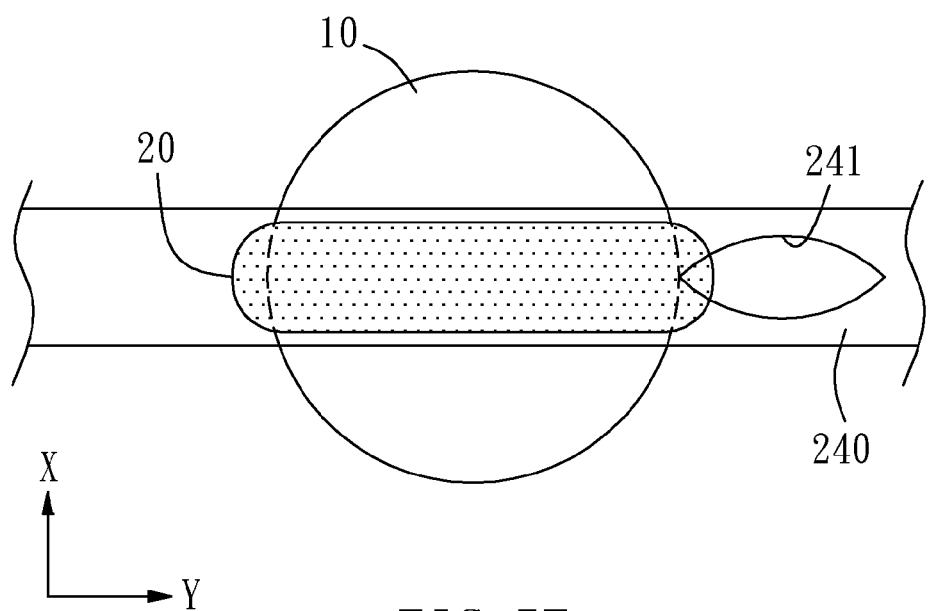

Considering aperture 241, FIG. 5C and FIG. 5D show its relative movement across the ion beam 20 along the Y-axis wherein only partial ion beam 20 passing through aperture 241 is implanted into the wafer 10. As examples, the scan speed may be a function of one or more of a predefined dose, a scan number, and the edge correction factor. Continuing with FIG. 5E and FIG. 5F, the aperture 241 is further moved across the ion beam 20 until it arrives on the other side of the wafer 10. Thus, a first one-dimensional scan (e.g., in the drawing, from left to right) of the ion beam 20 on the wafer 10 is achieved (e.g., with neither the wafer 10 nor the ion beam 20 being moved). Then, optionally, the ion beam current can be measured followed by calculation of a scan parameter, such as scan rate, for the next one-dimensional scan of the ion beam 20 on the wafer 10.

Figure 5G:
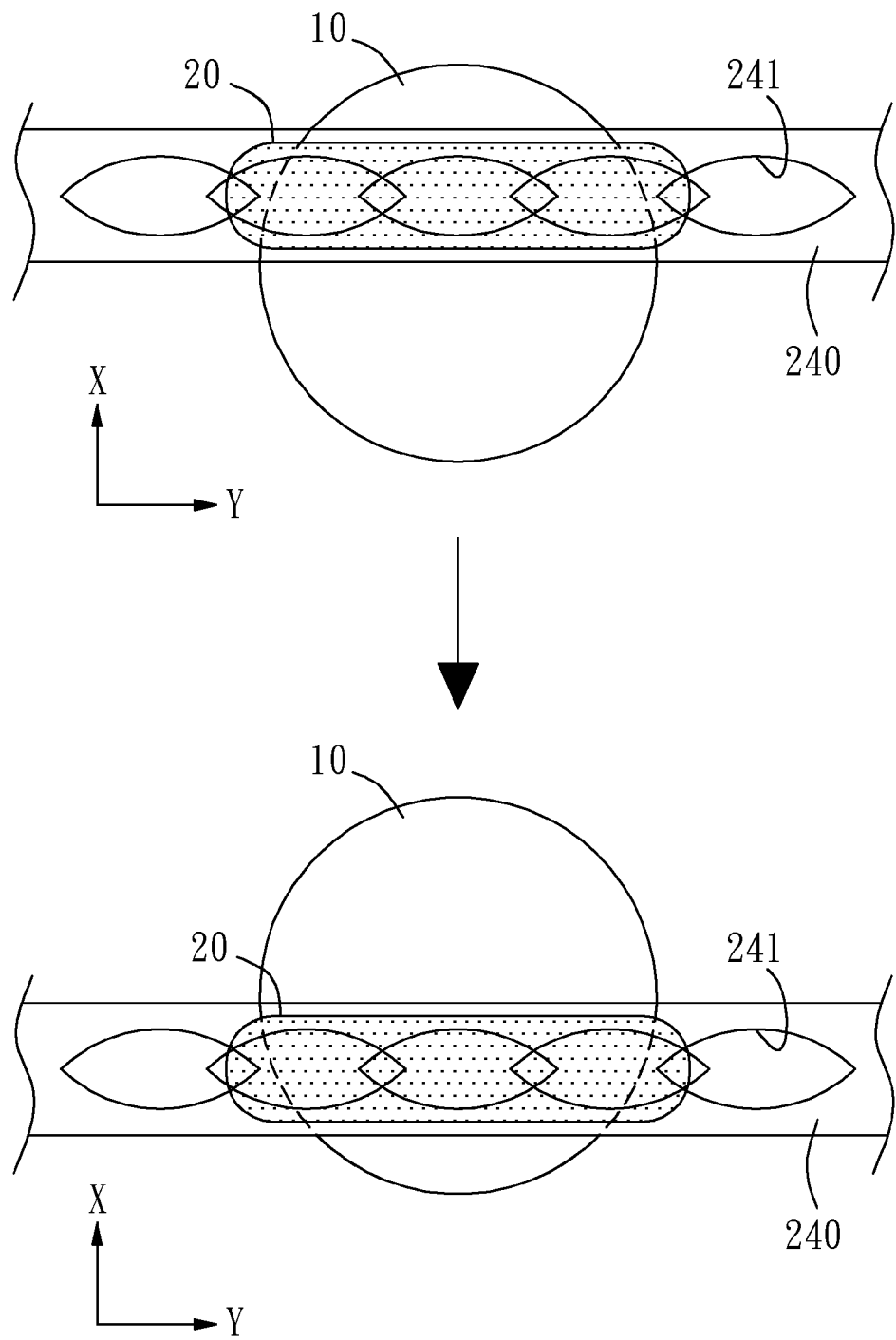

Thereafter, the aperture 241 can be moved to a second position (or, alternatively, held at its current position) of the Y-axis, and the wafer 10 is positioned (e.g., in the drawing, moved up or down along the X-direction) for the next step. As shown in FIG. 5G, by repeating the ion implant steps mentioned above, a second one-dimensional scan (e.g., in the drawing, from right to left) of the ion beam 20 on the wafer 10 is achieved. Additional one-dimensional scans can of course be implemented. Accordingly, by implementing these one-dimensional scans, a two-dimensional scan on the wafer 10 is achieved. While not shown, alternative but not interchangeable or equivalent implementations of the invention for FIGS. 5C-5F may include movement of the wafer 10 along the X-axis (e.g., in one or more of a simultaneous, intermittent, prior, or post fashion relative to movement of the aperture 241). The one-dimensional scans can be repeated until, for example, the wafer 10 has been scanned (e.g., the entire wafer has been two-dimensionally scanned) by projected area of the filtered ion beam.

Figure 6A:
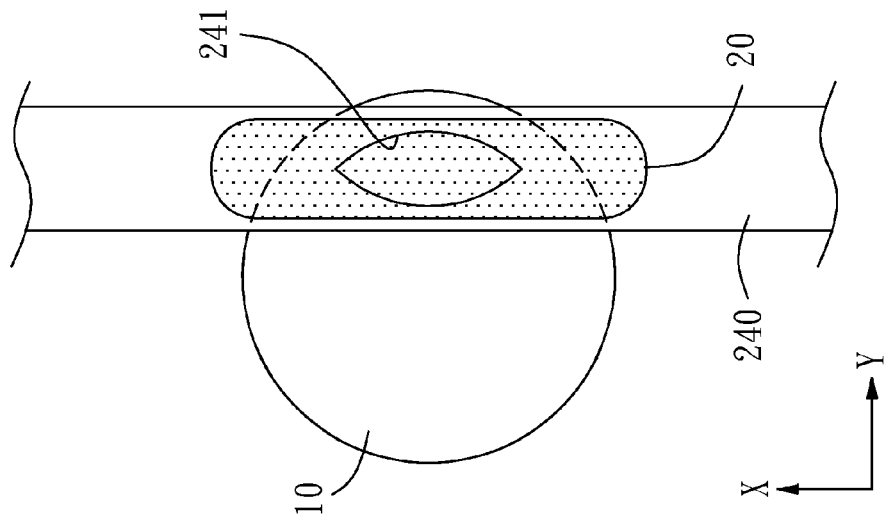
Figure 6B:
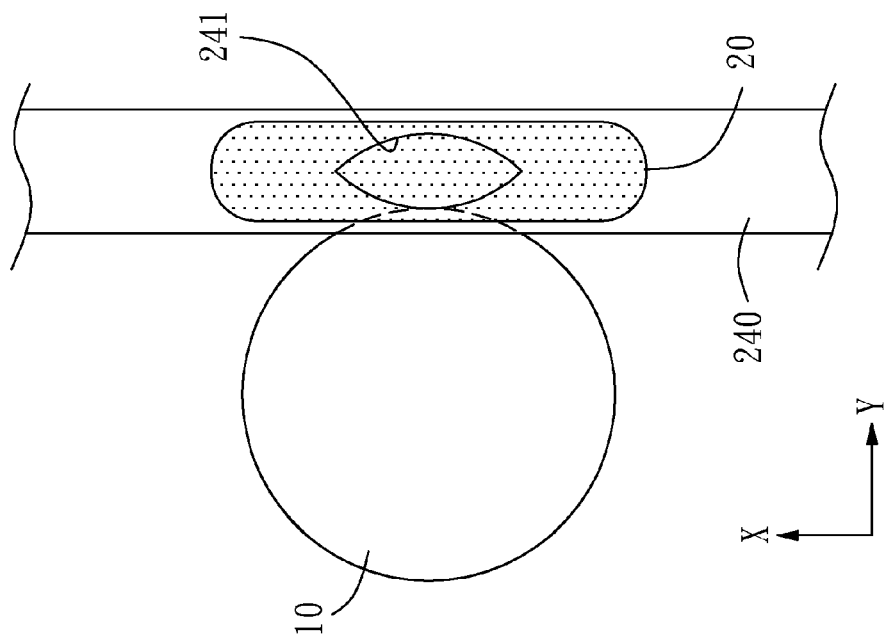
Figure 6C:
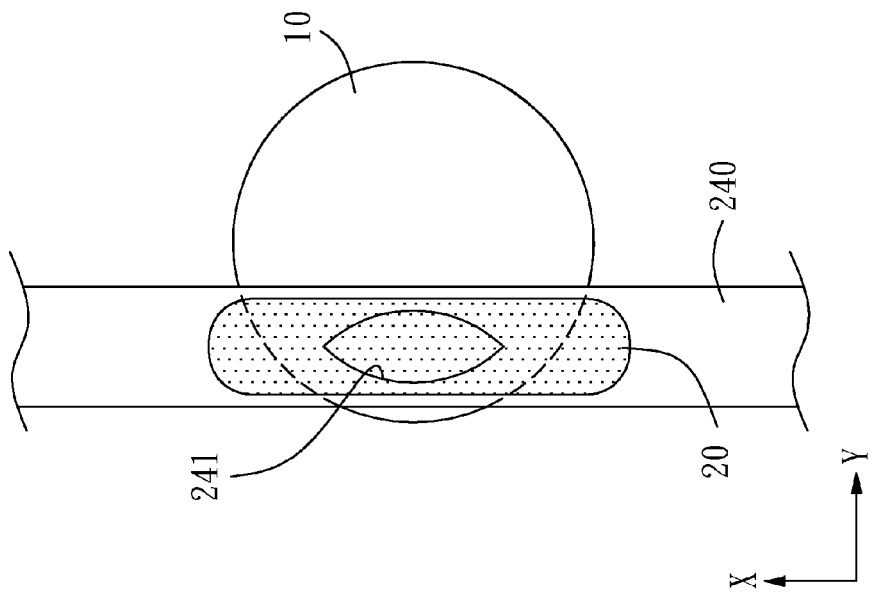
Figure 6D:
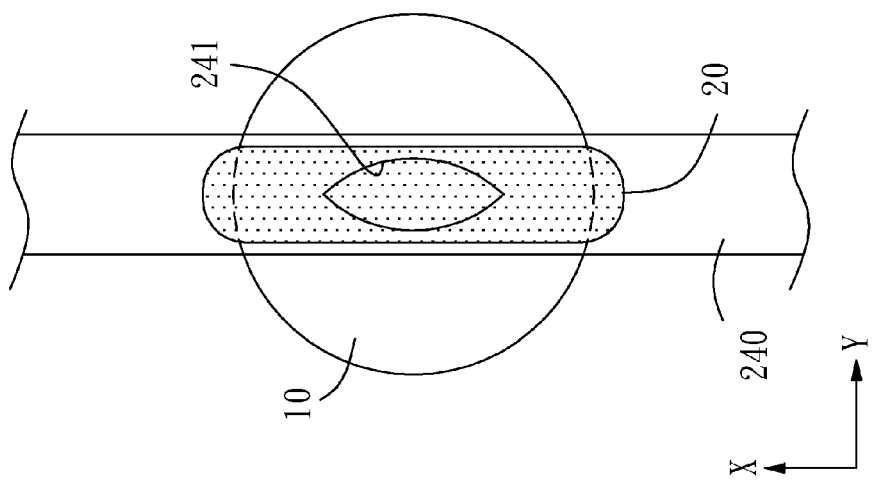
Figure 6G:
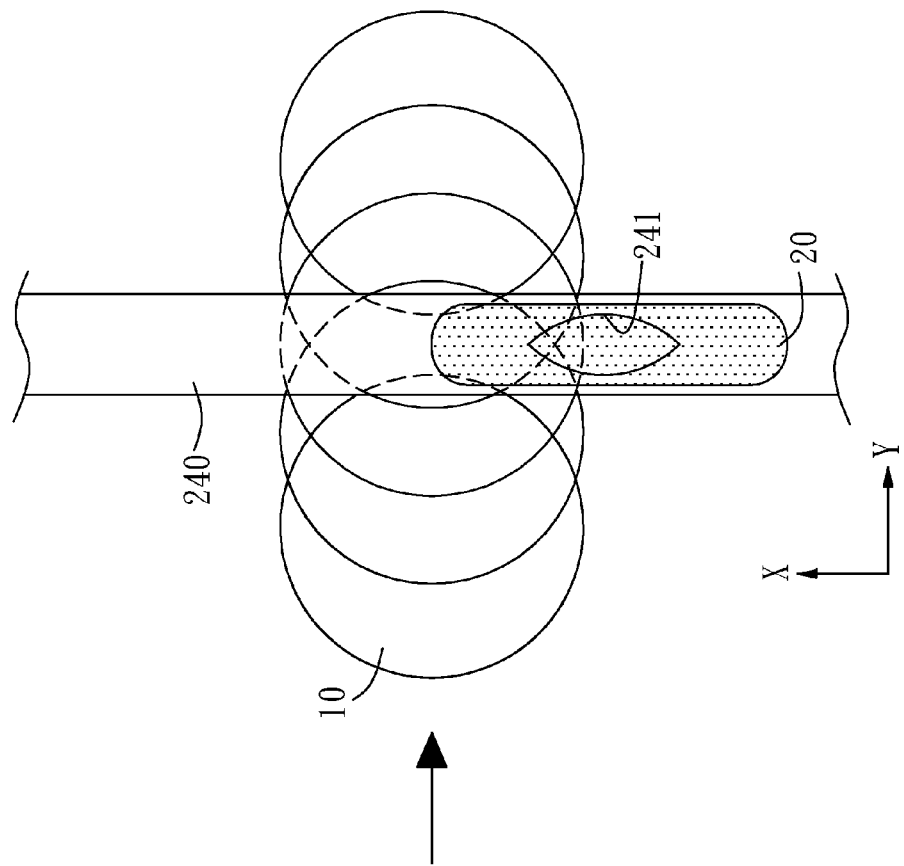
Figure 6G:
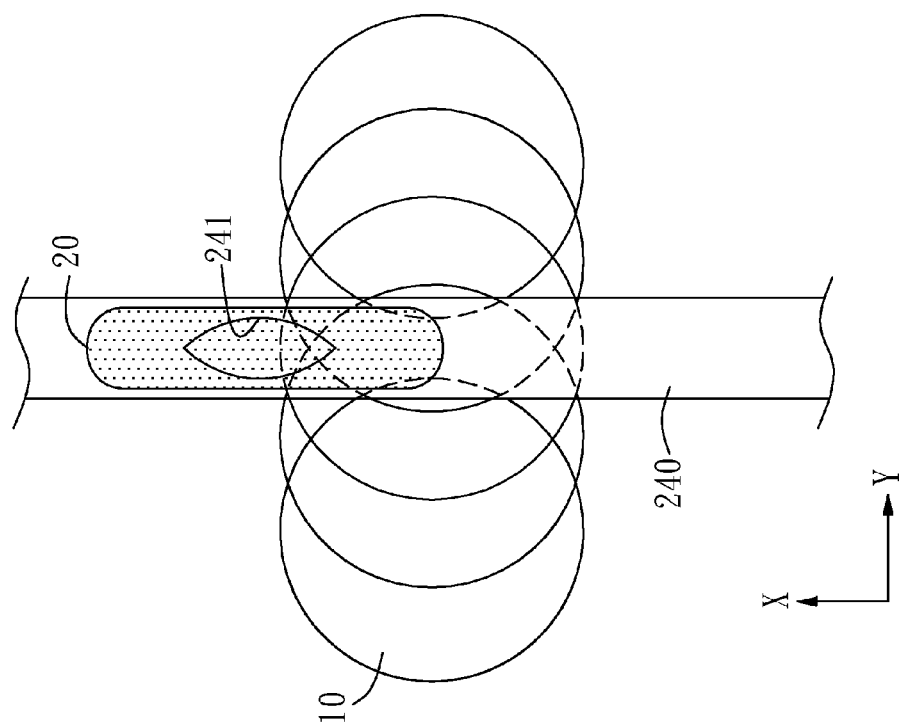

Another practical embodiment is now briefly described. Referring to FIG. 6A, locate the wafer 10 in a first position of the X-axis, and locate the aperture 241 on one side of the wafer 10 along the Y-axis. Now, considering wafer 10. FIGS. 6B, 6C and 6D show its relative movement across the ion beam 20 along the Y-axis whereby only the part of the ion beam 20 passing through aperture 241 is implanted into the wafer 10.

Referring to FIG. 6F, and FIG. 6F, move the wafer 10 across the ion beam 20 until it arrives on the other side thereof. Thus, a first one-dimensional scan of the ion beam 20 on the wafer 10 is achieved (e.g., without movement of the ion beam 20). Again, it is optional to measure the ion beam current and calculate a scan parameter, such as scan rate, for the next one-dimensional scan of the ion beam 20 through the aperture 241 across the wafer 10. Subsequently, move the wafer 10 to a second position of the X-axis and move the aperture 241 to the position for the next step. Therefore, as shown in FIG. 66, by repeating the ion implant steps mentioned above, a second one-dimensional scan of the ion beam 20 on the wafer 10 is achieved. As with the above example, additional one-dimensional scans of course can be implemented. Accordingly, when some one-dimensional scans are executed, two-dimensional scanning on the wafer 10 is achieved. While not shown, alternative but not interchangeable or equivalent implementations of the invention for FIGS. 6B-6F may include movement of the aperture 241 along the X-axis (e.g., in one or more of a simultaneous, intermittent, prior, or post fashion relative to movement of the wafer 10). The one-dimensional scans can be repeated until, for example, the wafer 10 has been scanned (e.g., the wafer has been fully two-dimensionally scanned) by projected area of the filtered ion beam.

Figure 7A:
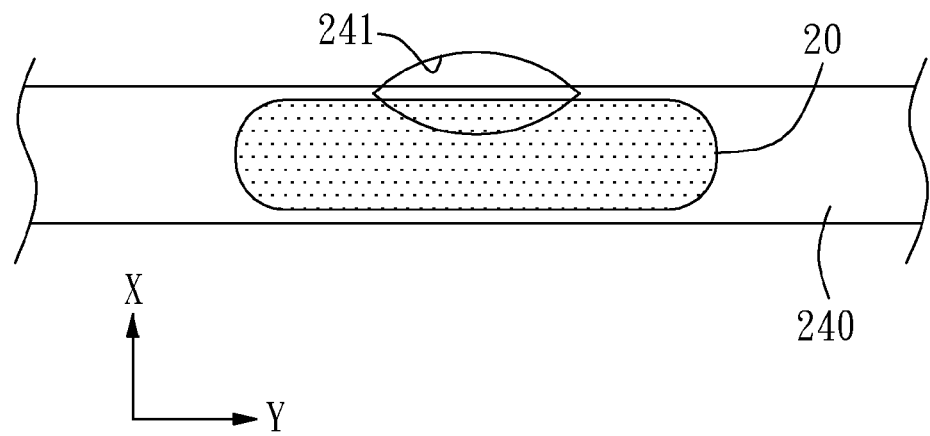
FIG. 7A and FIG. 7B show steps of optionally adjusting the filtered ion beam according to an embodiment of the invention.
Figure 7B:
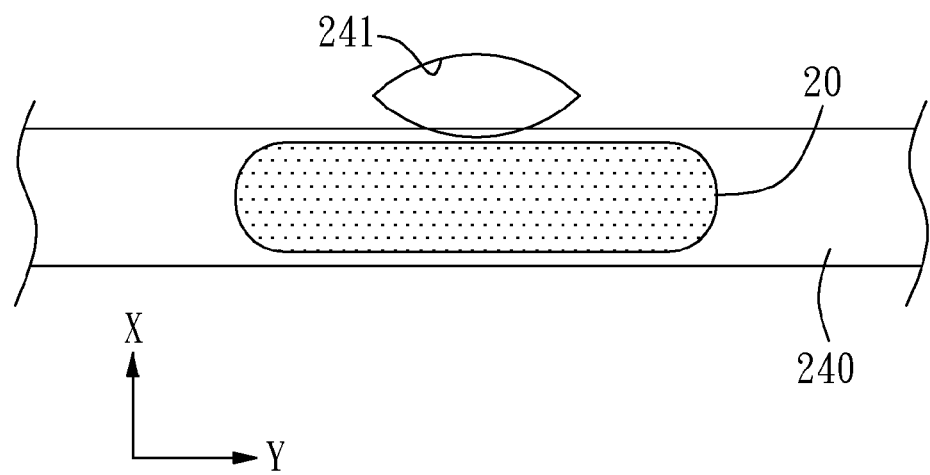

Furthermore, to more elastically adjust the shape of the filtered ion beam, the aperture 241 optionally can be slightly moved around the ion beam 20. For example, keep the aperture 241 in a fixed point of the Y-axis but slightly move aperture 241 along the x-axis. Hence, as shown in FIG. 7A and FIG. 7B, the projected area of the ion beam 20 on the wafer 10 may be deformed or totally blocked. Then, different portion(s) of the wafer 10 may be implanted by different implanted ion beam(s) or even may not be implanted to generate various dose distributions according to specific requirements. Clearly, the option may be more suitable for particular situations such as non-uniform two-dimensional implantation on the wafer 10.

Although specific embodiments have been illustrated and described, it will be appreciated by those skilled in the art that various modifications may be made without departing from the scope of the present invention, which is intended to be limited solely by the appended claims.

What is claimed is:

1. An ion implant method, comprising:
  providing a wafer, a fixed ribbon ion beam that is not scanned, and an aperture apparatus having an aperture;
  filtering said ribbon ion beam by using said aperture apparatus so that said wafer is implanted by part of said ribbon ion beam passing through said aperture; and
  using the movement of said wafer and the movement of said aperture to achieve a two-dimensional wafer scan,
  wherein a length of a cross section of the ion beam in a longitudinal direction thereof is smaller than a length of the wafer in the longitudinal direction.

2. The method as set forth in claim 1, further comprising controlling the shape and the size of said aperture to be similar to the shape and the size of a spot ion beam.

3. The method as set forth in claim 1, further comprising at least one of the following:
  moving said wafer along the short direction of said ribbon ion beam and moving said aperture along the long direction of said ribbon ion beam alternatively; and
  moving said wafer along the short direction of said ribbon ion beam and moving said aperture along the long direction of said ribbon ion beam simultaneously.

4. The method as set forth in claim 3, further comprising keeping the movement distance of said aperture along the long direction of said ribbon ion beam not larger than the size of said aperture along the long direction of said ribbon ion beam for each movement of said aperture.

5. The method as set forth in claim 1, further comprising:
moving said wafer across said ribbon ion beam so that said wafer is moved from a first side of said ribbon ion beam to an opposite second side of said ribbon ion beam;
operating said aperture mechanism so that said aperture is moved along said ribbon ion beam;
moving said wafer across said ribbon ion beam so that said wafer is moved from said second side of said ribbon ion beam to said first side of said ribbon ion beam;
operating said aperture mechanism so that said aperture is moved along said ribbon ion beam;
moving speeds of said aperture and said wafer can be adjusted during motions of said aperture and said wafer; and
repeating above steps until said two-dimensional wafer scan is achieved.

6. The method as set forth in claim 5, further comprising keeping the movement distance of said aperture along said ribbon ion beam briefly not larger than the size of said aperture along said ribbon ion beam for each movement of said aperture.

7. The method as set forth in claim 1, further comprising at least one of the following:
the shape of said aperture is similar to a traditional spot beam;
the shape of said aperture is a smooth or near Gaussian shape;
the shape of said aperture is chosen from a group consisting of the following: circle, oval, ellipse and diamond;
the size of said aperture along the beam height direction is about one-quarter to two-third of the diameter of said wafer;
the size of said aperture along the beam width direction is larger, the same or smaller than the ion beam width of said ribbon ion beam;
the size of said aperture is adjustable; and
the shape of said aperture is adjustable.

8. An ion implanter, comprising:
an ion beam assembly configured to generate a fixed ion beam that is not scanned;
a wafer moving mechanism configured to move a wafer along a first direction, wherein the movement direction of said wafer is vertical to said ion beam so that the incident angle between said wafer and said ion beam is fixed during a period of moving said wafer across said ion beam;
an aperture mechanism having an aperture configured to filter said ion beam before said wafer being implanted; and
an aperture moving mechanism configured to move said aperture mechanism along a second direction intersecting said first direction;
whereby a projected area of said filtered ion beam is two-dimensionally scanned over said wafer when said wafer and said aperture mechanism are moved along said first and second directions separately, and
wherein a length of a cross section of the ion beam in a longitudinal direction thereof is smaller than a length of the wafer in the longitudinal direction.

9. The ion implanter as set forth in claim 8, with said ion beam assembly delivers said ion beam along a fixed ion beam path without scanning said ion beam when said ion beam is proximate to said wafer.

10. The ion implanter as set forth in claim 8, further comprises at least one of the following:
said wafer moving mechanism moving said wafer only along said first direction
said aperture moving mechanism moving said aperture mechanism only along said second direction;
said wafer moving mechanism also slightly moving said wafer along said second direction, wherein the moved distance of said wafer along said second direction is briefly equal to a portion of said size of said aperture along said second direction; and
said aperture moving mechanism also slightly moving said aperture mechanism along said first direction, wherein the moved distance of said aperture mechanism is briefly equal to a portion of said size of said aperture along said first direction.

11. The ion implanter as set forth in claim 8, further comprises at least one of the following:
said size of said aperture along the beam height direction being smaller than the beam height of said ion beam;
said size of said aperture along the beam width direction being smaller than the beam width of said ion beam;
the area of said aperture being smaller than the cross-sectional area of said ion beam;
the shape of said aperture ensures a beam current distribution of said filtered ion beam drops to zero gradually at the edge of said aperture;
the shape of said aperture ensures a beam current distribution of said filtered ion beam has a smooth or near Gaussian distribution;
the shape of said aperture is adjustable; and
the shape of said aperture is chosen from a group consisting of the following: circle, oval, ellipse and diamond.

12. The ion implanter as set forth in claim 8, further comprising a shield positioned between said ion beam assembly and said aperture moving mechanism so that said aperture moving mechanism is not implanted by said ion beam.

13. An ion implanter, comprising:
an ion beam assembly capable of generating a fixed ion beam that is not scanned;
a wafer moving mechanism configured to move a wafer along a first direction;
an aperture mechanism having an aperture for filtering said ion beam before said wafer being implanted, wherein the area of said aperture is smaller than the cross-sectional area of said ion beam during a period of moving said aperture mechanism across said ion beam; and
an aperture moving mechanism configured to move said aperture along a second direction intersecting said first direction;
whereby a projected area of said filtered ion beam is two-dimensionally scanned over said wafer when said wafer and said aperture are moved along said first and second directions separately, and
wherein a length of a cross section of the ion beam in a longitudinal direction thereof is smaller than a length of the wafer in the longitudinal direction.

14. The ion implanter as set forth in claim 13, further comprises at least one of the following:
said size of said aperture along the beam height direction being smaller than the beam height of said ion beam; and
said size of said aperture along the beam width direction being smaller than the beam width of said ion beam.

15. The ion implanter as set forth in claim 13, further comprises at least one of the following:
said wafer moving mechanism moving said wafer only along said first direction;
said aperture moving mechanism moving said aperture mechanism only along said second direction;
said wafer moving mechanism also slightly moving said wafer along said second direction, wherein the moved distance of said wafer along said second direction is briefly equal to the size of said aperture along said second direction; and said aperture moving mechanism also slightly moving said aperture mechanism along said first direction, wherein the moved distance of said aperture mechanism is briefly to the said of said aperture along said first direction.

16. The ion implanter as set forth in claim 13, further comprises at least one of the following:

the shape of said aperture ensures a beam current distribution of said filtered ion beam drops to zero gradually at the edge of said aperture;

the shape of said aperture ensures a beam current distribution of said filtered ion beam has a smooth or near Gaussian distribution;

the shape of said aperture is adjustable; and the shape of said aperture is chosen from a group consisting of the following: circle, oval, ellipse and diamond.

17. The ion implanter as set forth in claim 13, further comprising a shield positioned between said ion beam assembly and said aperture moving mechanism so that said aperture moving mechanism may be not implanted by said ion beam.

18. An ion implant method, comprising:

providing a wafer, a fixed ion beam that is not scanned, and an aperture mechanism having an aperture configured to filter said ion beam before implanting said wafer; and moving said wafer along a first direction and said aperture mechanism along a second direction intersecting said first direction respectively, so that a projected area of said filtered ion beam is two-dimensionally scanned over said wafer;

wherein at least one of the following is performed: fixing the incident angle between said wafer and said ion beam during a period of moving said wafer across said ion beam; and keeping the area of said aperture smaller than the cross-sectional area of said ion beam during a period of moving said aperture across said ion beam; and wherein a length of a cross section of the ion beam in a longitudinal direction thereof is smaller than a length of the wafer in the longitudinal direction.

19. The method as set forth in claim 18, further comprising delivering said ion beam along a fixed ion beam path without scanning said ion beam when said ion beam is to be implanted into said wafer.

20. The ion implant method as set forth in claim 18, further comprising slightly moving said aperture mechanism along a direction intersecting said second direction so that the shape of said projected area of said ion beam is adjusted even the shape of said aperture is not adjusted.

21. The ion implant method as set forth in claim 18, wherein said wafer is two-dimensionally scanned by said projected area of said ion beam by the below steps:

(a) adjusting said aperture mechanism, such that said aperture is located under a first portion of said ion beam and above a first specific point of said wafer;

(b) adjusting said aperture mechanism, such that said aperture is moved along said second direction and at least a first portion of said wafer is implanted;

(c) moving said wafer, such that said aperture is located above a second specific point of said wafer;

(d) adjusting said aperture mechanism, such that said aperture is moved along said second direction and at least a second portion of said wafer is implanted; and (e) repeating steps (c) and (d) in sequence, until said wafer is two-dimensionally scanned by said projected area of said ion beam.

22. The ion implant method as set forth in claim 18, wherein said wafer is two-dimensionally scanned by said projected area of said ion beam by the below steps:

(a) adjusting said aperture mechanism, such that said aperture is located under a first portion of said ion beam;

(b) moving said wafer along said first direction, such that at least a first portion of said wafer is implanted by a first filtered ion beam filtered by said aperture;

(c) adjusting said aperture mechanism, such that said aperture is moved along a second direction and said aperture is located under a second portion of said ion beam;

(d) moving said wafer along said first direction, such that at least a second portion of said wafer is implanted by a second filtered ion beam filtered by said aperture; and (e) repeating steps (c) and (d) in sequence, until said wafer is two-dimensionally scanned by said projected area of said ion beam.

23. The method as set forth in claim 18, further comprises at least one of the following:

moving said wafer only along said first direction;

moving said aperture mechanism only along said second direction; moving slightly said wafer along said second direction, wherein the moved distance of said wafer along said second direction is briefly equal to a portion of said size of said aperture along said second direction; and moving slightly said aperture mechanism along said first direction, wherein the moved distance of said aperture mechanism is briefly equal to said size of said aperture along said first direction.

24. The method as set forth in claim 18, further comprises at least one of the following:

adjusting said aperture mechanism so that said size of said aperture along the beam height direction is smaller than the beam height of said ion beam;

adjusting said aperture mechanism so that said size of said aperture along the beam width direction is smaller than the beam width of said ion beam;

adjusting said aperture mechanism so that the area of said aperture is smaller than the cross-sectional area of said ion beam;

adjusting said aperture mechanism so that the shape of said aperture ensures a beam current distribution of said filtered ion beam drops to zero gradually at the edge of said aperture;

adjusting said aperture mechanism so that the shape of said aperture ensures a beam current distribution of said filtered ion beam has a smooth or near Gaussian distribution;

adjusting said aperture mechanism so that the shape of said aperture is adjustable; and adjusting said aperture mechanism so that the shape of said aperture is chosen from a group consisting of the following: circle, oval, ellipse and diamond.

25. The method as set forth in claim 18, further comprising at least one of the following:

adjusting a first velocity of said wafer and a second velocity of said aperture mechanism, such that said ion beam projected area can be scanned through different points of said wafer by an adjustable velocity; and adjusting at least one scanning parameter when said aperture is not completely filled by said ion beam or said filtered ion beam is not completely projected on said wafer.

26. The method as set forth in claim 25, further comprising at least one of the following:

adjusting a first velocity of said wafer and a second velocity of said aperture mechanism as a function of said filtered ion beam density distribution, such that said ion beam projected area can be scanned through different points of said wafer by an adjustable velocity to generate specific dose distribution on said wafer.

27. The ion beam density distribution of said ribbon ion beam in claim 1 can be uniform or non-uniform.

* * * * *